United States Patent
Kim et al.

(10) Patent No.: US 12,424,598 B2
(45) Date of Patent: Sep. 23, 2025

(54) DISPLAY DEVICE AND TILED DISPLAY DEVICE

(71) Applicant: Samsung Display Co., LTD., Yongin-si (KR)

(72) Inventors: Hyun Joon Kim, Yongin-si (KR); Jung Hwan Hwang, Yongin-si (KR); Kye Uk Lee, Yongin-si (KR); Sang Jin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 407 days.

(21) Appl. No.: 17/984,104

(22) Filed: Nov. 9, 2022

(65) Prior Publication Data

US 2023/0268329 A1    Aug. 24, 2023

(30) Foreign Application Priority Data

Jan. 26, 2022 (KR) .................. 10-2022-0011507
May 4, 2022 (KR) .................. 10-2022-0055668

(51) Int. Cl.
*H01L 25/16* (2023.01)
*H10D 86/40* (2025.01)
(Continued)

(52) U.S. Cl.
CPC ......... *H01L 25/167* (2013.01); *H10D 86/441* (2025.01); *H10D 86/60* (2025.01); *H10H 20/851* (2025.01)

(58) Field of Classification Search
CPC .... H10D 86/441; H10D 86/60; H10D 86/451; H10D 86/021; H10H 20/8513; H10H 20/851; H10H 20/855; H10H 20/84; H10H 20/8515; H10H 20/8512; H10H 20/0361; H10H 20/857; H10H 20/825; H10H 20/854; H10H 20/853; H10H 20/819; H01L 25/0753; H01L 25/167; H10K 59/131; H10K 59/126; H10K 59/38; H10K 59/124; H10K 50/826; H10K 59/35;
(Continued)

(56) References Cited

U.S. PATENT DOCUMENTS 10,090,335 B2   10/2018   Kang et al.
10,983,381 B2    4/2021   Jeong et al.
(Continued)

FOREIGN PATENT DOCUMENTS

CN       110416242 A    11/2019
KR   10-2018-0046494 A   5/2018
KR   10-2020-0060595 A   6/2020

*Primary Examiner* — Mouloucoulaye Inoussa
(74) *Attorney, Agent, or Firm* — Womble Bond Dickinson (US) LLP

(57) ABSTRACT

A display device includes a substrate including an emission area and a non-emission area, a pixel circuit layer above the substrate, and including a transistor and a signal line in the non-emission area, and a color conversion pattern in the emission area, a light emitting element above the color conversion pattern, and electrically connected to the transistor, an insulating layer covering the light emitting element, and a pad above the insulating layer, and electrically connected to the signal line, wherein the color conversion pattern is configured to convert a wavelength band of light incident from the light emitting element.

20 Claims, 18 Drawing Sheets

(51) Int. Cl.
*H10D 86/60* (2025.01)
*H10H 20/851* (2025.01)

(58) Field of Classification Search
CPC ........... H10K 59/1213; H10K 59/1216; H10K 71/40; H10K 59/12; H10K 2102/3023; G02B 5/201
See application file for complete search history.

(56) References Cited

U.S. PATENT DOCUMENTS

| | | | | |
|---|---|---|---|---|
| 2013/0120981 | A1* | 5/2013 | Kim | F21V 9/08 |
| | | | | 362/231 |
| 2015/0187856 | A1* | 7/2015 | Park | H10K 59/131 |
| | | | | 257/40 |
| 2015/0187989 | A1* | 7/2015 | Sato | H10K 59/878 |
| | | | | 257/98 |
| 2015/0370116 | A1* | 12/2015 | Chae | G02F 1/13394 |
| | | | | 349/43 |
| 2016/0141349 | A1* | 5/2016 | Yun | H10K 59/126 |
| | | | | 438/23 |
| 2018/0122883 | A1* | 5/2018 | Beak | H10D 30/6723 |
| 2018/0182815 | A1* | 6/2018 | Choi | H10K 59/124 |
| 2019/0385991 | A1* | 12/2019 | Kim | H01L 25/167 |
| 2020/0098841 | A1* | 3/2020 | Song | H10D 30/6723 |
| 2021/0217739 | A1* | 7/2021 | Lee | H01L 25/0753 |
| 2021/0313303 | A1 | 10/2021 | Takeya et al. | |
| 2021/0408104 | A1* | 12/2021 | Lee | H10H 20/831 |
| 2022/0037415 | A1* | 2/2022 | Lin | H10K 59/126 |
| 2024/0145643 | A1* | 5/2024 | Kim | H10D 86/451 |

\* cited by examiner

FIG. 1
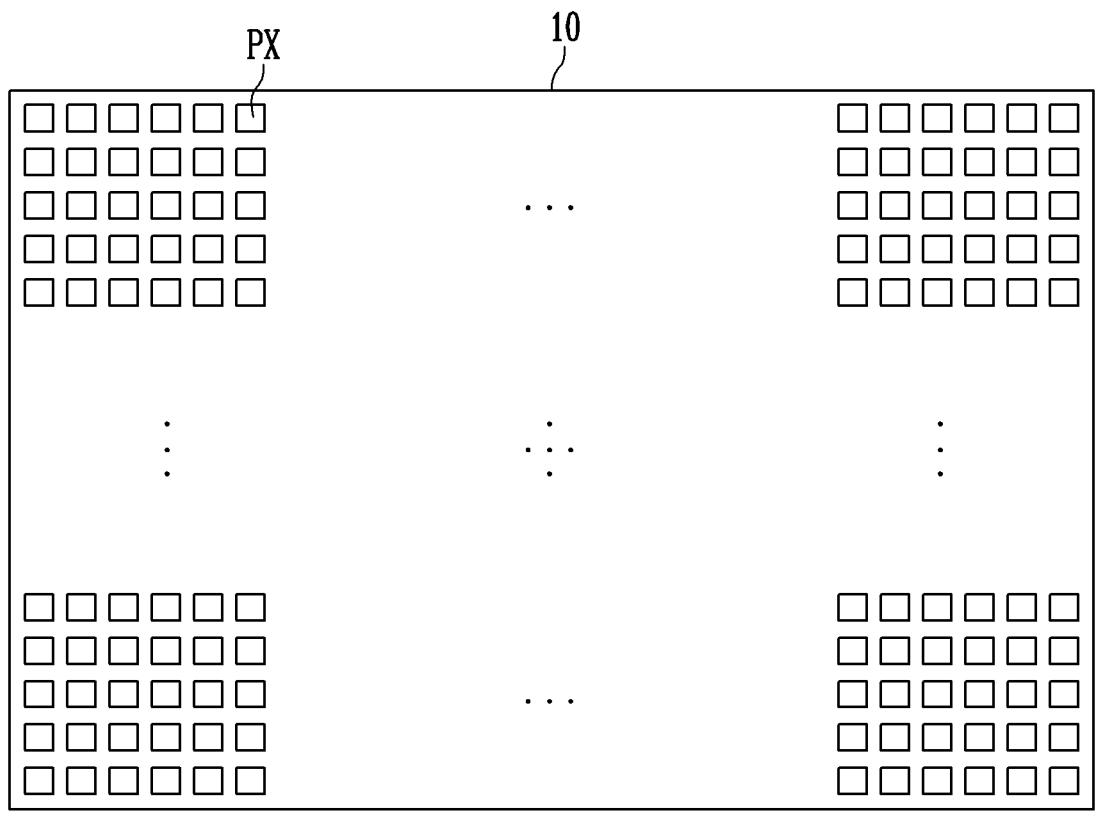
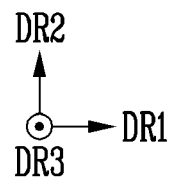

DISPLAY DEVICE AND TILED DISPLAY DEVICE

CROSS-REFERENCE TO RELATED APPLICATION

The application claims priority to, and the benefit of, Korean patent application No. 10-2022-0011507 filed on Jan. 26, 2022, and Korean patent application No. 10-2022-0055668 filed on May 4, 2022, in the Korean Intellectual Property Office, the entire disclosure of which is incorporated herein by reference.

BACKGROUND

1. Field

The present disclosure generally relates to a display device and a tiled display device.

2. Description of the Related Art

As interest in information displays and demand for portable information media increase, research and commercialization has focused on display devices.

SUMMARY

Embodiments provide a display device that has an improved yield and is bezel-less.

In accordance with an aspect of the present disclosure, there is provided a display device including a substrate including an emission area and a non-emission area, a pixel circuit layer above the substrate, and including a transistor and a signal line in the non-emission area, and a color conversion pattern in the emission area, a light emitting element above the color conversion pattern, and electrically connected to the transistor, an insulating layer covering the light emitting element, and a pad above the insulating layer, and electrically connected to the signal line, wherein the color conversion pattern is configured to convert a wavelength band of light incident from the light emitting element.

The color conversion pattern may be in an opening exposing the substrate while penetrating the pixel circuit layer is formed in the emission area.

The pixel circuit layer may further include a color filter between the substrate and the color conversion pattern in the emission area.

The transistor and the signal line may be separated from the emission area, wherein the light emitting element is configured to emit light through the color filter and the substrate in the emission area.

The light emitting element may include a flip chip type micro light emitting diode.

The display device may further include sub-pixels including the light emitting element for emitting light of a first color, and configured to respectively express different single colors.

The display device may further include a first connection electrode above the light emitting element, and electrically connecting a first electrode of the light emitting element to the transistor.

The pixel circuit layer may further include a light-blocking layer between the substrate and the transistor in the non-emission area.

The light-blocking layer may be separated from the emission area in plan view.

The display device may further include a fan-out line above the insulating layer, connected to the pad, and electrically connected to the signal line through a contact hole penetrating the insulating layer.

The display device may further include pixels including the light emitting element, wherein a distance from an outermost one of the pixels to an edge of the substrate in plan view is shorter than a distance between adjacent ones of the pixels in plan view.

In accordance with another aspect of the present disclosure, there is provided a display device including a substrate including an emission area and a non-emission area, a transistor, a signal line, and a power line on the emission area of the substrate, a light emitting element on the emission area of the substrate, a first connection electrode above the light emitting element, and electrically connecting a first electrode of the light emitting element to the transistor, a second connection electrode above the light emitting element, and electrically connecting a second electrode of the light emitting element to the power line, an insulating layer over the first connection electrode and the second connection electrode, and a pad above the insulating layer, electrically connected to the signal line, and including at least a portion overlapping the light emitting element in plan view.

The display device may further include a color filter between the substrate and the light emitting element in the emission area.

The transistor and the signal line may be separated from the emission area in plan view, wherein the light emitting element is configured to emit light through the color filter and the substrate in the emission area.

The light emitting element may include a flip chip type micro light emitting diode.

The display device may further include a light-blocking layer between the substrate and the transistor in the non-emission area.

In accordance with still another aspect of the present disclosure, there is provided a tiled display device including a display devices, and a joining part between the display devices, wherein a first display device among the plurality of display devices includes a substrate including an emission area and a non-emission area, a pixel circuit layer above the substrate, and including a transistor and a signal line in the non-emission area, and a color conversion pattern in the emission area, a light emitting element above the color conversion pattern, and electrically connected to the transistor, an insulating layer covering the light emitting element, and a pad above the insulating layer, and electrically connected to the signal line, wherein the color conversion pattern is configured to convert a wavelength band of light incident from the light emitting element.

The light emitting element may include a flip chip type micro light emitting diode.

The substrate may include glass.

The display devices may be arranged in a matrix form on M rows and N columns.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 is a plan view illustrating a display device in accordance with one or more embodiments of the present disclosure.

DETAILED DESCRIPTION

Figure 2:
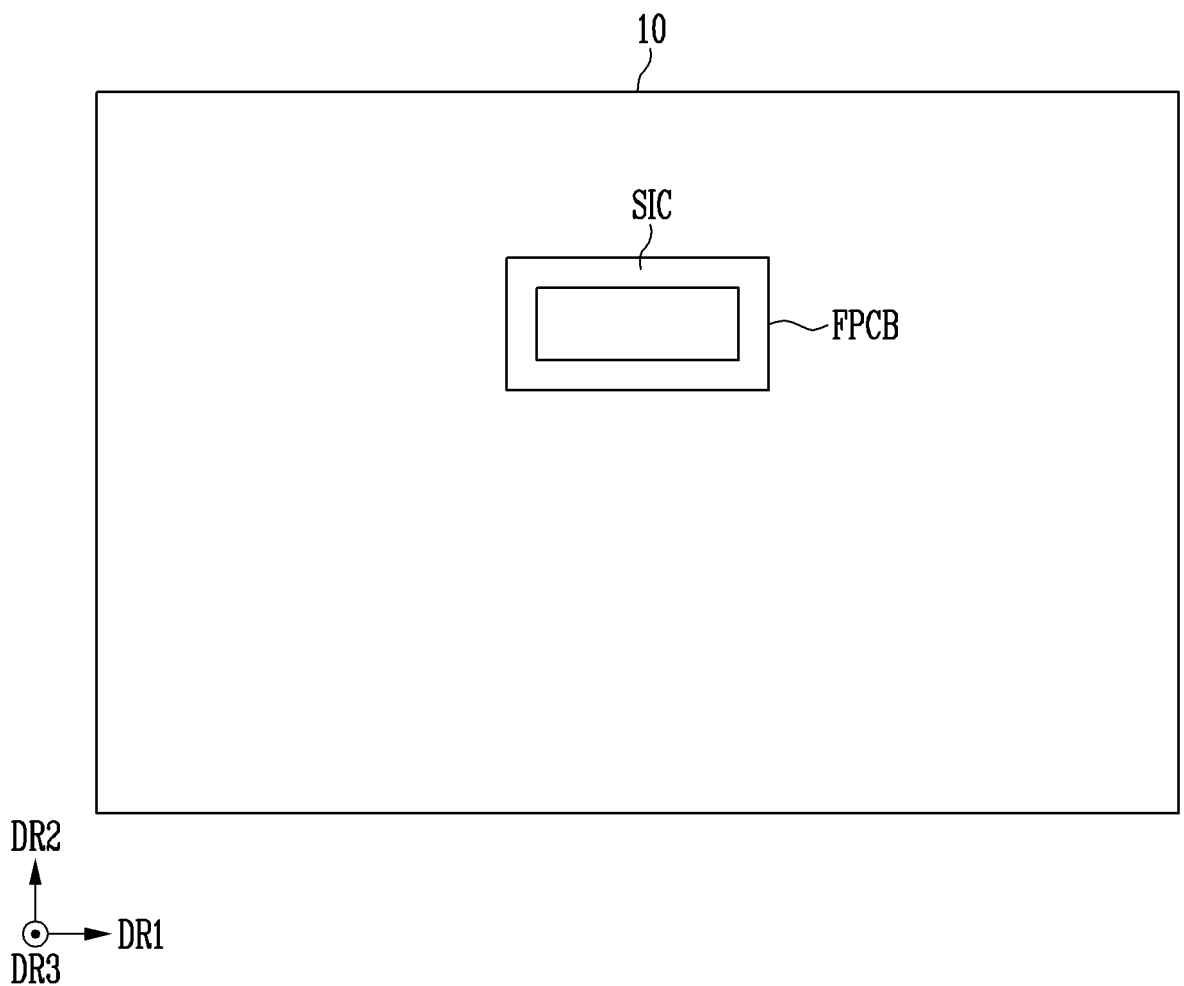
FIG. 2 is a plan view illustrating one or more embodiments of the display device shown in FIG. 1.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 3:
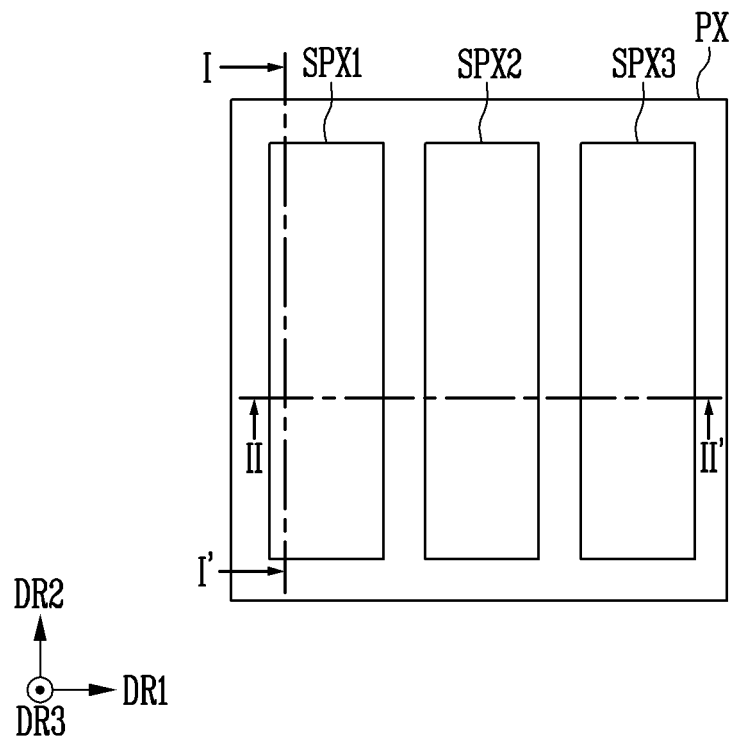
FIG. 3 is a view illustrating an example of a pixel shown in FIG. 1.
Figure 4:
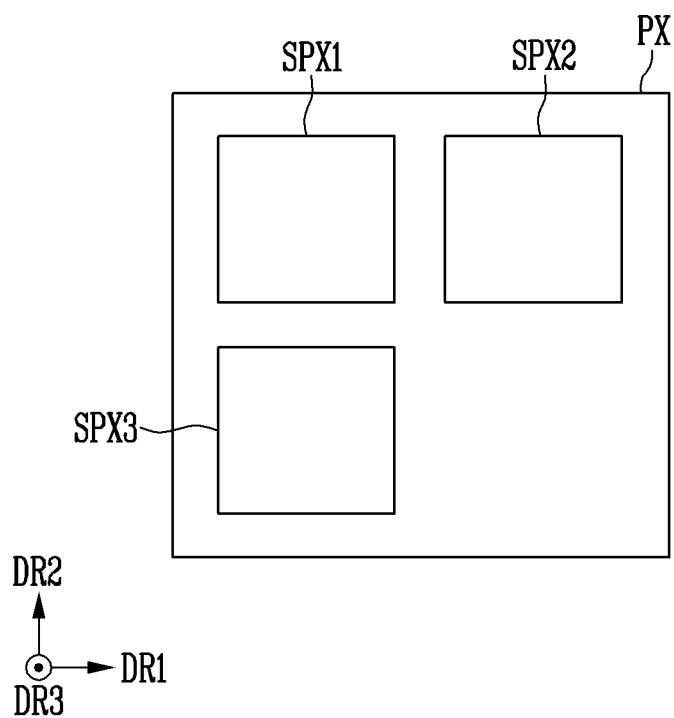
FIG. 4 is a view illustrating another example of the pixel shown in FIG. 1.

FIG. 1 is a plan view illustrating a display device in accordance with one or more embodiments of the present disclosure. FIG. 2 is a plan view illustrating one or more embodiments of the display device shown in FIG. 1. In FIG. 2, a display device 10 including a source driving circuit SIC is illustrated. FIG. 3 is a view illustrating an example of a pixel shown in FIG. 1. FIG. 4 is a view illustrating another example of the pixel shown in FIG. 1.

First, referring to FIG. 1, the display device 10 (or a display panel) is a device for displaying an image (e.g., a moving image or a still image), and may be used as a display screen of portable electronic devices such as a mobile phone, a smart phone, a tablet personal computer (PC), a smart watch, a watch phone, a mobile communication terminal, an electronic notebook, an electronic book, a portable multimedia player (PMP), a navigation system, an ultra-mobile PC (UMPC), as well as a display screen of various products such as a television, a notebook computer, a computer monitor, a digital billboard, and Internet of Things (IoT).

The display device 10 may be formed in a planar shape of a rectangle having long sides in a first direction DR1 and short sides in a second direction DR2 intersecting the first direction DR1. A corner at which a long side in the first direction DR1 and a short side in the second direction DR2 meet each other may be formed at a right angle or be formed round to have a curvature (e.g., predetermined curvature). The planar shape of the display device 10 is not limited to a quadrangular shape, and may be formed in another polygonal shape, a circular shape, or an elliptical shape. The display device 10 may be formed flat, but the present disclosure is not limited thereto. For example, the display device 10 may include a curved part that is formed at a left/right end, and has a constant curvature or a changing curvature. In addition, the display device 10 may be formed flexible to be curvable, warpable, bendable, foldable, or rollable.

To display an image, the display device 10 may further include pixels PX, scan lines extending in the first direction DR1, and data lines extending in the second direction DR2. The pixels PX may be arranged in a matrix form in the first direction DR1 and the second direction DR2.

Referring to FIG. 2, the source driving circuit SIC for providing a data signal (or data voltage) to the pixels PX through the data lines may be located at an uppermost portion in a third direction DR3. For example, the source driving circuit SIC may be mounted on a flexible film FPCB, and may be coupled to an upper surface of the display panel (e.g., a panel in which the pixels PX and the data lines are formed) through the flexible film FPCB. The display device 10 may display an image in the opposite direction of the third direction DR3. An arrangement of the source driving circuit SIC will be described later with reference to FIGS. 7 and 16.

Each of the pixels PX may include a plurality of sub-pixels SPX1 to SPX3 as shown in FIGS. 3 and 4. Although a case where each of the pixels PX includes three sub-pixels SPX1 to SPX3 (e.g., a first sub-pixel SPX1, a second sub-pixel SPX2, and a third sub-pixel SPX3 is depicted in FIGS. 3 and 4, the present disclosure is not limited thereto.

Each of the first sub-pixel SPX1, the second sub-pixel SPX2, and the third sub-pixel SPX3 may be connected to at least one data line among the data lines and at least one scan line among the scan lines.

Each of the first sub-pixel SPX1, the second sub-pixel SPX2, and the third sub-pixel SPX3 may have a planar shape of a rectangle, a square, or a rhombus. For example, each of the first sub-pixel SPX1, the second sub-pixel SPX2, and the third sub-pixel SPX3 may have a planar shape of a rectangle having short sides in the first direction DR1 and long sides in the second direction DR2 as shown in FIG. 3. Alternatively, each of the first sub-pixel SPX1, the second sub-pixel SPX2, and the third sub-pixel SPX3 may have a planar shape of a square or a rhombus, which includes sides having the same length in the first direction DR1 and the second direction DR2 as shown in FIG. 4.

As shown in FIG. 3, the first sub-pixel SPX1, the second sub-pixel SPX2, and the third sub-pixel SPX3 may be arranged in the first direction DR1. Alternatively, any one of the second sub-pixel SPX2 and the third sub-pixel SPX3 and the first sub-pixel SPX1 may be arranged in the first direction DR1, and the other and the first sub-pixel SPX1 may be arranged in the second direction DR2. For example, as shown in FIG. 4, the first sub-pixel SPX1 and the second sub-pixel SPX2 may be arranged in the first direction DR1, and the first sub-pixel SPX1 and the third sub-pixel SPX3 may be arranged in the second direction DR2.

Alternatively, any one of the first sub-pixel SPX1 and the third sub-pixel SPX3 may be arranged in the first direction DR1 with the second sub-pixel SPX2, and the other of the first sub-pixel SPX1 and the third sub-pixel SPX3 may be arranged in the second direction DR2 with the second sub-pixel SPX2. Alternatively, any one of the first sub-pixel SPX1 and the second sub-pixel SPX2 may be arranged in the first direction DR1 with the third sub-pixel SPX3, and the other of the first sub-pixel SPX1 and the second sub-pixel SPX2 may be arranged in the second direction DR2 with the third sub-pixel SPX3.

The first sub-pixel SPX1 may emit first light, the second sub-pixel SPX2 may emit second light, and the third sub-pixel SPX3 may emit third light. The first light may be light in a red wavelength band, the second light may be light in a green wavelength band, and the third light may be light in a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm. However, the present disclosure is not limited thereto.

Each of the first sub-pixel SPX1, the second sub-pixel SPX2, and the third sub-pixel SPX3 is a light emitting element for emitting light, and may include an inorganic light emitting element having an inorganic semiconductor. For example, the inorganic light emitting element may be a flip chip type light emitting diode (LED), but the present disclosure is not limited thereto.

As shown in FIGS. 3 and 4, an area of the first sub-pixel SPX1, an area of the second sub-pixel SPX2, and an area of the third sub-pixel SPX3 may be substantially the same, but the present disclosure is not limited thereto. At least one of the area of the first sub-pixel SPX1, the area of the second sub-pixel SPX2, and the area of the third sub-pixel SPX3 may be different from area of another sub-pixel. Alternatively, two of the area of the first sub-pixel SPX1, the area of the second sub-pixel SPX2, and the area of the third sub-pixel SPX3 may be substantially the same, and the other may be different from the two. Alternatively, the area of the first sub-pixel SPX1, the area of the second sub-pixel SPX2, and the area of the third sub-pixel SPX3 may be different from one another.

Figure 5:
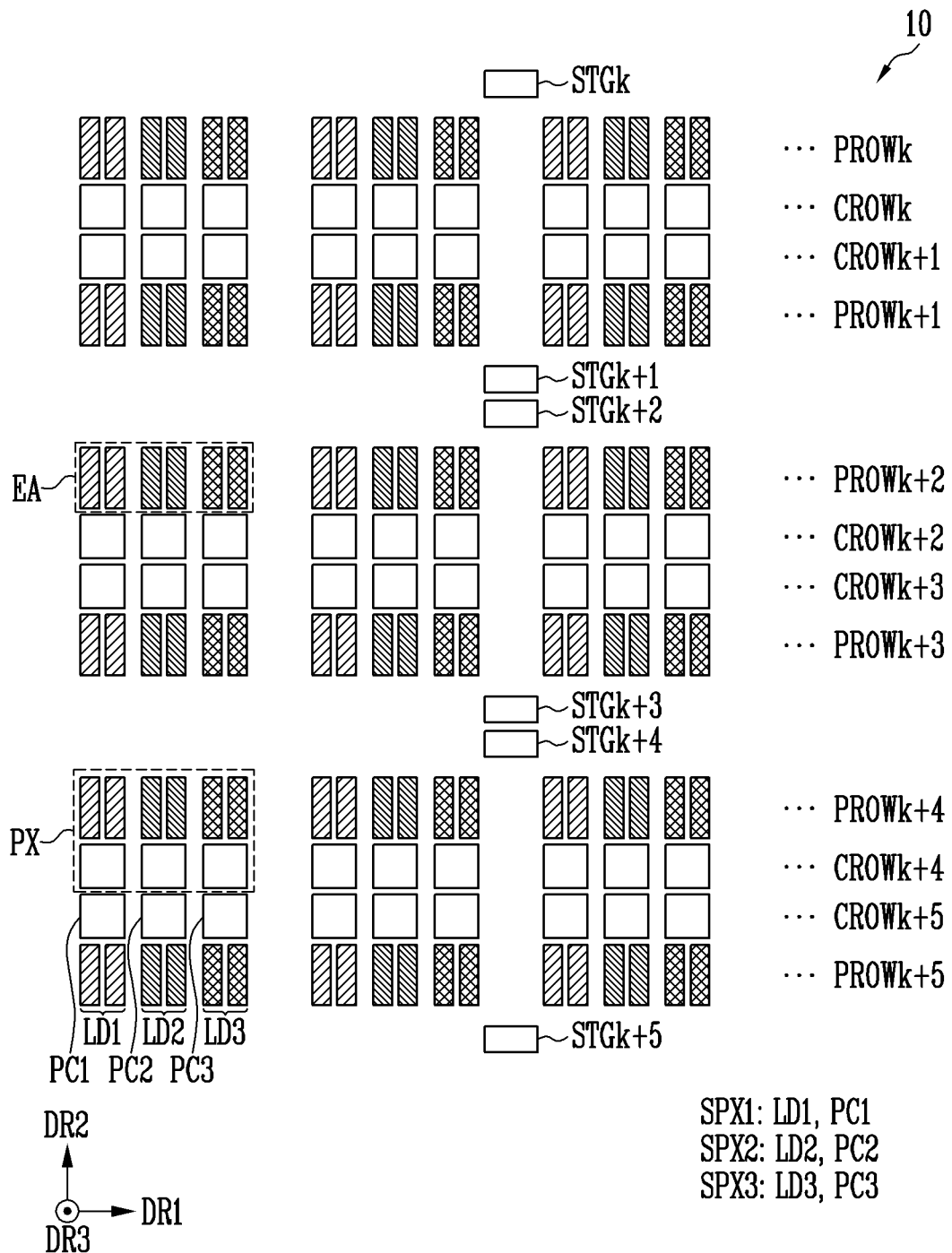
FIG. 5 is a plan view illustrating one or more embodiments of the display device shown in FIG. 1.
Figure 6:
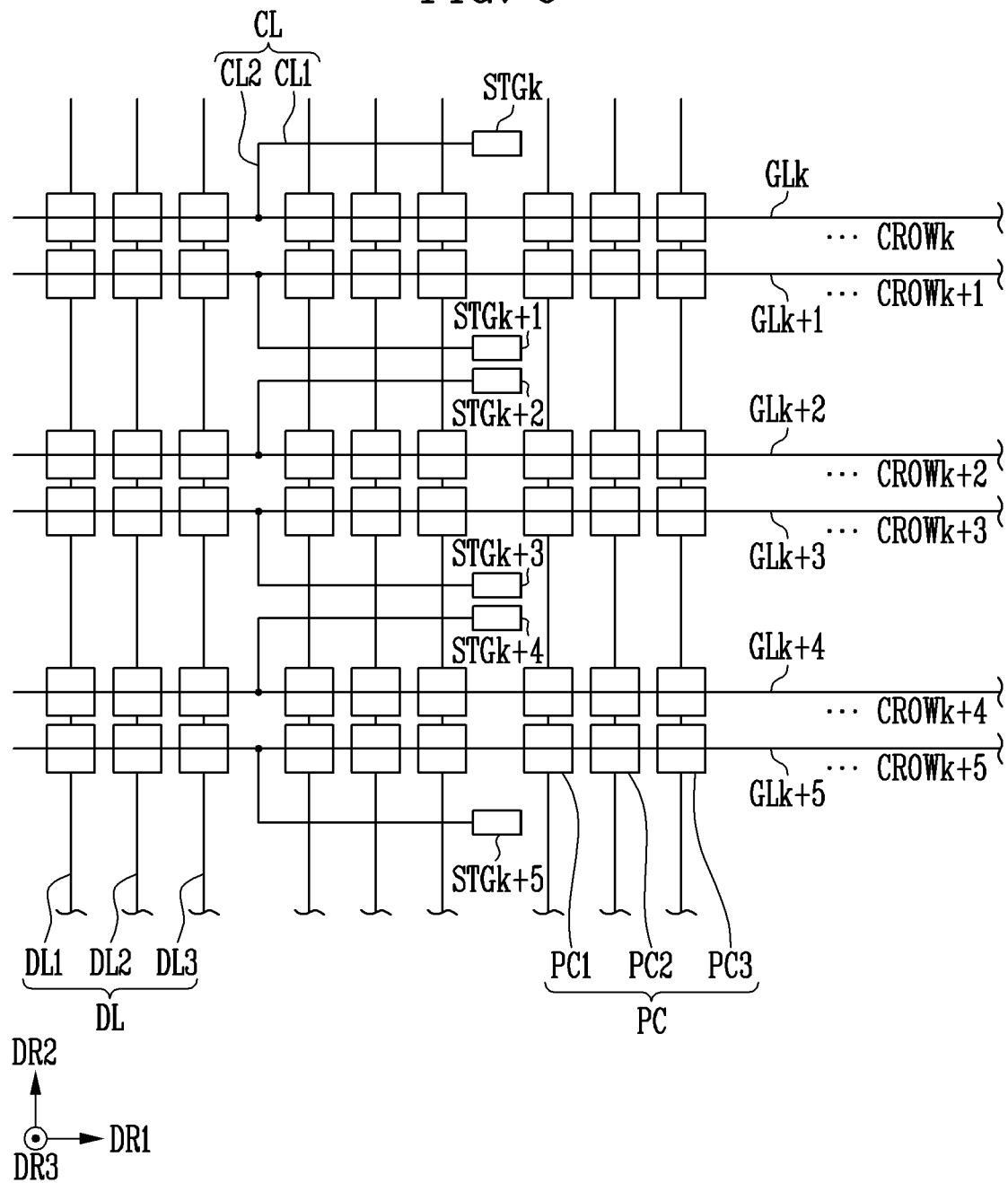
FIG. 6 is a view illustrating a connection relationship between a pixel circuit and a stage, which are included in the display device shown in FIG. 5.

FIG. 5 is a plan view illustrating one or more embodiments of the display device shown in FIG. 1. FIG. 6 is a view illustrating a connection relationship between a pixel circuit and a stage, which are included in the display device shown in FIG. 5. A plurality of stages may constitute at least one gate driver (or scan driver).

Referring to FIGS. 1 to 5, the display device 10 (or the display panel) may include a pixel PX, and the pixel PX may include a first sub-pixel SPX1, a second sub-pixel SPX2, and a third sub-pixel SPX3.

The first sub-pixel SPX1 may include a first light emitting element LD1 and a first pixel circuit PC1, and the first pixel circuit PC1 may supply a driving current to the first light emitting element LD1. The first pixel circuit PC1 may be located in the second direction DR2 with respect to the first light emitting element LD1, and may be electrically connected to the first light emitting element LD1. The second sub-pixel SPX2 may include a second light emitting element LD2 and a second pixel circuit PC2, and the second pixel circuit PC2 may supply a driving current to the second light emitting element LD2. The second pixel circuit PC2 may be located in the second direction DR2 with respect to the second light emitting element LD2, and may be electrically connected to the second light emitting element LD2. The third sub-pixel SPX3 may include a third light emitting element LD3 and a third pixel circuit PC3, and the third pixel circuit PC3 may supply a driving current to the third light emitting element LD3. The third pixel circuit PC3 may be located in the second direction DR2 with respect to the third light emitting element LD3, and may be electrically connected to the third light emitting element LD3. Each of the pixel circuits PC1 to PC3 may include at least one transistor (see "TFT" shown in FIG. 7) and at least one capacitor.

In some embodiments, each of the sub-pixels SPX1 to SPX3 may include two light emitting elements. For example, each of the sub-pixels SPX1 to SPX3 may include a main light emitting element and a repair light emitting element, but the present disclosure is not limited thereto. In another example, each of the sub-pixels SPX1 to SPX3 may include three or more light emitting elements.

Pixels PX may be arranged to have a uniform pixel pitch with respect to the light emitting elements LD1 to LD3. The light emitting elements LD1 to LD3 may be arranged along a plurality of pixel rows. For example, the light emitting elements LD1 to LD3 may be arranged along kth to (k+5)th pixel rows PROWk to PROWk+5 (k is a positive integer). The pixel circuits PC1 to PC3 may be arranged along a plurality of circuit rows. The pixel circuits PC1 to PC3 may be arranged along kth to (k+5)th circuit rows CROWk to CROWk+5.

The kth pixel row PROWk may be adjacent to the kth circuit row CROWk in the opposite direction of the second direction DR2, and the (k+1)th pixel row PROWk+1 may be adjacent to the (k+1)th circuit row CROWk+1 in the second direction DR2. The kth circuit row CROWk and the (k+1)th circuit row CROWk+1 may be located between the kth pixel row PROWk and the (k+1)th pixel row PROWk+1. Similarly, the (k+2)th pixel row PROWk+2 may be adjacent to the (k+2)th circuit row CROWk+2 in the opposite direction of the second direction DR2, and the (k+3)th pixel row PROWk+3 may be adjacent to the (k+3)th circuit row CROWk+3 in the second direction DR2. The (k+2)th circuit row CROWk+2 and the (k+3)th circuit row CROWk+3 may be located between the (k+2)th pixel row PROWk+2 and the (k+3)th pixel row PROWk+3. Similarly, the (k+4)th pixel row PROWk+4 may be adjacent to the (k+4)th circuit row CROWk+4 in the opposite direction of the second direction DR2, and the (k+5)th pixel row PROWk+5 may be adjacent to the (k+5)th circuit row CROWk+5 in the second direction DR2. The (k+4)th circuit row CROWk+4 and the (k+5)th circuit row CROWk+5 may be located between the (k+4)th pixel row PROWk+4 and the (k+5)th pixel row PROWk+5.

As shown in FIG. 6, a kth stage STGk may be located at an upper side of the kth circuit row CROWk and the kth pixel row PROWk. The kth stage STGk may supply a gate signal to a kth gate line GLk connected to pixel circuits PC1 to PC3 of the kth circuit row CROWk. The kth stage STGk may be connected to the kth gate line GLk through a connection line CL. The kth stage STGk may be connected to the kth gate line GLk through a first connection line CL1 extending in the first direction DR1 and a second connection line CL2 extending in the second direction DR2.

A (k+1)th stage STGk+1 and a (k+2)th stage STGk+2 may be located between the (k+1)th pixel row PROWk+1 and the (k+2)th pixel row PROWk+2. The (k+1)th stage STGk+1 may be located at a lower side of the (k+1)th circuit row CROWk+1 and the (k+1)th pixel row PROWk+1. The (k+1)th stage STGk+1 may supply a gate signal to a (k+1)th gate line GLk+1 connected to pixel circuits PC of the (k+1)th circuit row CROWk+1. The (k+1)th stage STGk+1 may be connected to the (k+1)th gate line GLk+1 through a connection line CL.

A (k+2)th stage STGk+2 may be located at an upper side of the (k+2)th circuit row CROWk+2 and the (k+2)th pixel row PROWk+2. The (k+2)th stage STGk+2 may supply a gate signal to a (k+2)th gate line GLk+2 connected to pixel circuits PC of the (k+2)th circuit row CROWk+2. The (k+2)th stage STGk+2 may be connected to the (k+2)th gate line GLk+2 through a connection line CL.

A (k+3)th stage STGk+3 and a (k+4)th stage STGk+4 may be located between the (k+3)th pixel row PROWk+3 and the (k+4)th pixel row PROWk+4. The (k+3)th stage STGk+3 may be located at a lower side of the (k+3)th circuit row CROWk+3 and the (k+3)th pixel row PROWk+3. The (k+3)th stage STGk+3 may supply a gate signal to a (k+3)th gate line GLk+3 connected to pixel circuits PC of the (k+3)th circuit row CROWk+3. The (k+3)th stage STGk+3 may be connected to the (k+3)th gate line GLk+3 through a connection line CL.

The (k+4)th stage STGk+4 may be located at an upper side of the (k+4)th circuit row CROWk+4 and the (k+4)th pixel row PROWk+4. The (k+4)th stage STGk+4 may supply a gate signal to a (k+4)th gate line GLk+4 connected to pixel circuits PC of the (k+4)th circuit row CROWk+4. The (k+4)th stage STGk+4 may be connected to the (k+4)th gate line GLk+4 through a connection line CL.

A (k+5)th stage STGk+5 may be located at a lower side of the (k+5)th circuit row CROWk+5 and the (k+5)th pixel row PROWk+5. The (k+5)th stage STGk+5 may supply a gate signal to a (k+5)th gate line GLk+5 connected to pixel circuits PC of the (k+5)th circuit row CROWk+5. The (k+5)th stage STGk+5 may be connected to the (k+5)th gate line GLk+5 through a connection line CL.

A data line DL may include data lines DL1 to DL3. A first data line may supply a data signal to a plurality of first pixel circuit PC1 located on the same column. A second data line DL2 may supply a data signal to a plurality of second pixel circuits PC2 located on the same column. A third data line DL3 may supply a data signal to a plurality of third pixel circuits PC3 located on the same column.

Figure 7:
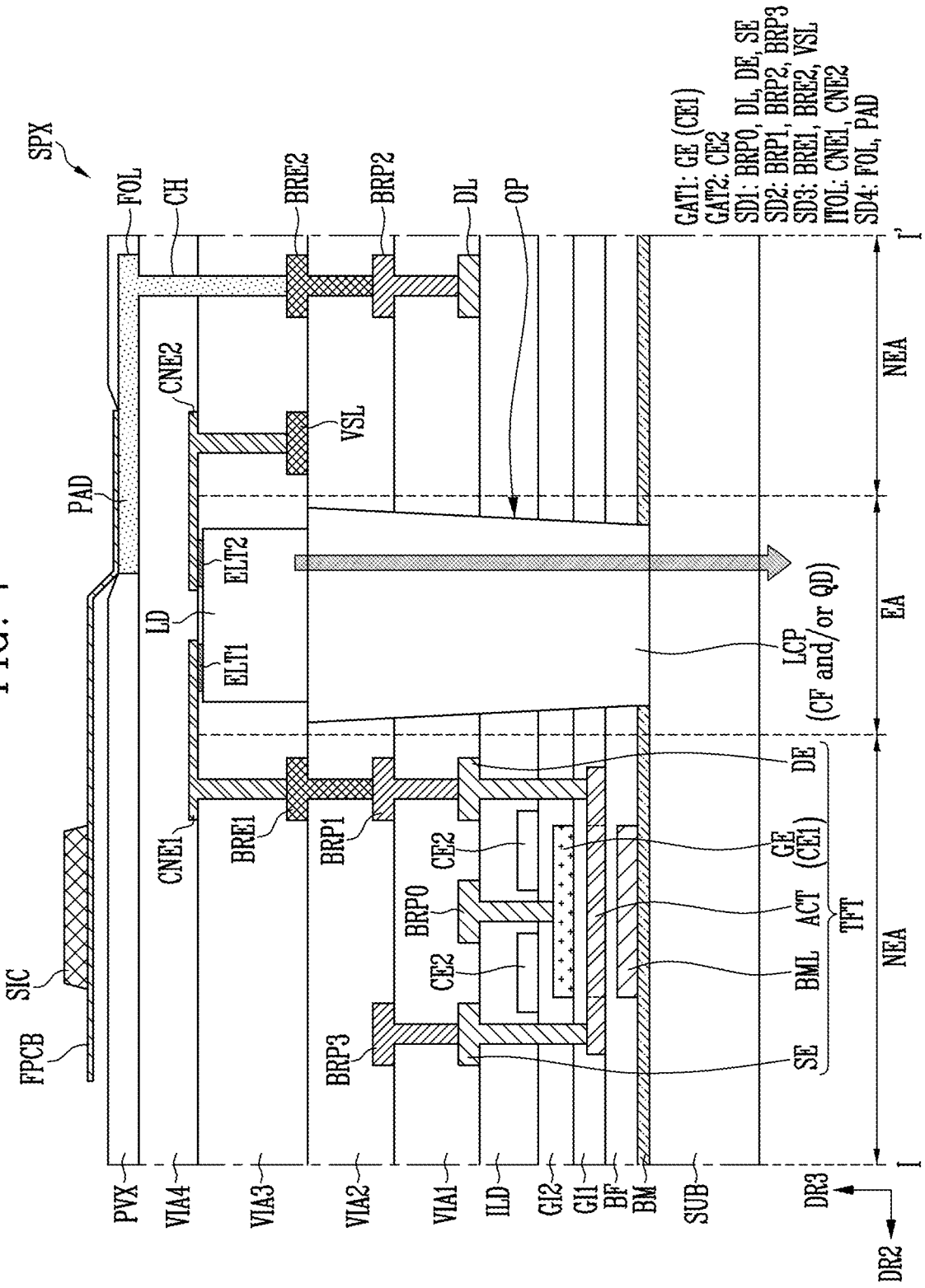
FIG. 7 is a sectional view schematically illustrating an example of a sub-pixel taken along the line I-I' shown in FIG. 3.

FIG. 7 is a sectional view schematically illustrating an example of a sub-pixel taken along the line I-I' shown in FIG. 3. The sub-pixels SPX1 to SPX3 shown in FIG. 3 are substantially identical or similar to one another. Therefore, the sub-pixels SPX1 to SPX3 shown in FIG. 3 are commonly designated as sub-pixels SPX. Hereinafter, a sub-pixel SPX will be described.

Referring to FIGS. 1 to 7, the sub-pixel SPX (or the display device 10 (see FIG. 1)) may include a substrate SUB, a buffer layer BF, a light-blocking layer BM (or light blocking pattern), an active layer ACT (or active pattern), a first gate insulating layer GI1, a first gate layer GAT1, a second gate insulating layer GI2, a second gate layer GAT2, an interlayer insulating layer ILD, a first source metal layer SD1, a first via layer VIA1 (or first insulating layer), a second source metal layer SD2, a second via layer VIA2 (or second insulating layer), a third source metal layer SD3, a third via layer VIA3 (or third insulating layer), a fourth source metal layer SD4, a fourth via layer VIA4 (or fourth insulating layer), and a protective layer PVX. Also, the sub-pixel SPX (or the display device 10 (see FIG. 1)) may include a light conversion pattern LCP and a light emitting element LD. For convenience of description, the components from the buffer layer on which a thin film transistor TFT (and the light conversion pattern LCP) is formed to the third source metal layer SD3 may be referred to as a pixel circuit layer.

In one or more embodiments of the present disclosure, as long as any other description is not provided, the term "being formed and/or provided in the same layer" may mean being formed in the same process, and the term "being formed and/or provided in different layers" may mean being formed in different processes.

The substrate SUB may be a base substrate or a base member, which is used to support the display device 10. The substrate SUB may be a rigid substrate made of glass. Alternatively, the substrate SUB may be a flexible substrate to be bendable, foldable, rollable, and the like. The substrate SUB may include an insulating material including a polymer resin such as polyimide (PI).

The substrate SUB may include an emission area EA and a non-emission area NEA with respect to one sub-pixel SPX. The emission area EA may be an area in which light is transmitted therethrough, and the non-emission area NEA may be an area in which transmission of light is blocked. On a plane, the light conversion pattern LCP and the light emitting element LD may be provided in the emission area EA, and the thin film transistor TFT (or transistor) and a signal line (e.g., a data line DL and a power line VSL) may be located in the non-emission area NEA. In addition, driving circuits (e.g., a demultiplexer, an electrostatic discharge protection circuit, and the like) including the stages STGk to STGk+5 described with reference to FIG. 5 may be located in the non-emission area NEA. The thin film transistor TFT and the signal line are not located in the emission area EA.

The light-blocking layer BM may be located on one surface of the substrate SUB. The light-blocking layer BM may be substantially located in the non-emission area NEA, and may define the emission area EA. The light-blocking layer BM may be located between the substrate SUB and the thin film transistor TFT. The light-blocking layer BM may include/define an opening corresponding to the emission area EA. In other words, the light-blocking layer BM may not substantially overlap with the emission area EA on a plan. The light-blocking layer BM may include a light blocking material. In an example, the light-blocking layer BM may be a black matrix. The light-blocking layer BM may reduce or prevent a light leakage defect in which light (or beam) is leaked between the sub-pixel SPX and a sub-pixel SPX adjacent thereto, and may reduce or prevent a color mixture of lights.

The buffer layer BF may be located on the light-blocking layer BM. The buffer layer BF may be a layer for reducing or preventing infiltration of air or moisture. The buffer layer BF may be configured with a plurality of inorganic layers that are alternately stacked. For example, the buffer layer BF may be formed as a multi-layer in which one or more inorganic layers among a silicon nitride layer, a silicon oxynitride layer, a silicon oxide layer, a titanium oxide layer, and an aluminum oxide layer are alternately stacked. In some embodiments, the buffer layer BF may be omitted. The buffer layer BF may include/define an opening corresponding to the emission area EA.

In one or more embodiments, a lower electrode layer BML (or lower electrode) may be located on the light-blocking layer BM. The lower electrode layer BML may overlap with the active layer ACT (or a channel of the thin film transistor TFT) in the third direction DR3. The lower electrode layer BML may block light irradiated onto the active layer ACT in the third direction DR3, thereby reducing or minimizing a characteristic change of the thin film transistor TFT, which is caused by the light. The lower electrode layer BML may be formed as a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

The active layer ACT may be located on the buffer layer BF. The active layer ACT may include a silicon semiconductor such as polycrystalline silicon, single crystalline silicon, low polycrystalline silicon, and amorphous silicon, or include an oxide semiconductor.

The active layer ACT may include the channel, a source region, and a drain region of the thin film transistor TFT. The channel of the thin film transistor TFT may be a region overlapping with a gate electrode GE of the thin film transistor TFT in the third direction DR3 as a thickness direction of the substrate SUB. The source region of the thin film transistor TFT may be located at one side of the channel, and the drain electrode of the thin film transistor TFT may be located at the other side of the channel. The source region and the drain region of the thin film transistor TFT may be regions not overlapping with the gate electrode GE in the third direction DR3. The source region and drain region of the thin film transistor TFT may be regions in which ions are doped in a silicon semiconductor or an oxide semiconductor, to have conductivity.

The first gate insulating layer GI1 may be located over the active layer ACT. The first gate insulating layer GI1 may be formed as an inorganic layer (e.g., a silicon nitride layer, a silicon oxynitride layer, a silicon oxide layer, a titanium oxide layer, or an aluminum oxide layer), but the present disclosure is not limited thereto. The first gate insulating layer GI1 may include/define an opening corresponding to the emission area EA.

The first gate layer GAT1 may be located on the first gate insulating layer GI1. The first gate layer GAT1 may include the gate electrode GE of the thin film transistor TFT and a first capacitor electrode CE1. The first capacitor electrode CE1 may be integrally formed with the gate electrode GE, but the present disclosure is not limited thereto. For example, the first capacitor electrode CE1 may be located to be spaced apart from the gate electrode GE. The first gate layer GAT1 may be formed as a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

The second gate insulating layer GI2 may be located over the first gate layer GAT1. The second gate insulating layer GI2 may be formed as an inorganic layer (e.g., a silicon nitride layer, a silicon oxynitride layer, a silicon oxide layer, a titanium oxide layer, or an aluminum oxide layer), but the present disclosure is not limited thereto. The second gate insulating layer GI2 may include/define an opening corresponding to the emission area EA.

The second gate layer GAT2 may be located on the second gate insulating layer GI2. The second gate layer GAT2 may include a second capacitor electrode CE2. The second capacitor electrode CE2 along with the first capacitor electrode CE1 may constitute a capacitor (e.g., a storage capacitor for storing a data signal for the sub-pixel SPX or a voltage corresponding thereto).

The second gate layer GAT2 may be formed as a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

The interlayer insulating layer ILD may be located over the second gate layer GAT2. The interlayer insulating layer ILD may be formed as an inorganic layer (e.g., a silicon nitride layer, a silicon oxynitride layer, a silicon oxide layer, a titanium oxide layer, or an aluminum oxide layer), but the present disclosure is not limited thereto. The interlayer insulating layer ILD may include/define an opening corresponding to the emission area EA.

The first source metal layer SD1 may be located on the interlayer insulating layer ILD. The first source metal layer SD1 may include a first transistor electrode SE, a second transistor electrode DE, a bridge pattern BRP0, and the data line DL. The first transistor electrode SE may be connected to the source region of the active layer ACT (e.g., a source region of an active pattern of the thin film transistor TFT) through a contact hole penetrating the interlayer insulating layer ILD and the second gate insulating layer GI2. Similarly, the second transistor electrode DE may be connected to the drain region of the active layer ACT (e.g., a drain region of the active pattern of the thin film transistor TFT) through a contact hole penetrating the interlayer insulating layer ILD and the second gate insulating layer GI2. The bridge pattern BRP0 may be connected to the gate electrode GE through a contact hole penetrating the interlayer insulating layer ILD. In some embodiments, the bridge pattern BRP0 may be omitted. The data line DL may be the data line DL described with reference to FIG. 6.

The first source metal layer SD1 may be formed as a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

The first via layer VIA1 may be located over the first source metal layer SD1. The first via layer VIA1 may be a first planarization layer for planarizing a step difference caused by the active layer ACT, the first gate layer GAT1, the second gate layer GAT2, and the first source metal layer SD1, but the present disclosure is not limited thereto. For example, the first via layer VIA1 may be formed as an organic layer such as acrylic resin, epoxy resin, phenolic resin, polyamide resin, or polyimide resin. In some embodiments, the first via layer VIA1 may be formed as an inorganic layer (e.g., a silicon nitride layer, a silicon oxynitride layer, a silicon oxide layer, a titanium oxide layer, or an aluminum oxide layer). In another example, the first via layer VIA1 may be formed as a multi-layer including an organic layer and an inorganic layer, which are sequentially stacked. The first via layer VIA1 may include/define an opening corresponding to the emission area EA.

The second source metal layer SD2 may be located on the first via layer VIA1. The second source metal layer SD2 may include a first bridge pattern BRP1, a second bridge pattern BRP2, and a third bridge pattern BRP3. The first bridge pattern BRP1 may be connected to the second transistor electrode DE through a contact hole penetrating the first via layer VIA1. Similarly, the second bridge BRP2 may be connected to the data line DL through a contact hole penetrating the first via layer VIA1. The third bridge pattern BRP3 may be connected to the first transistor electrode SE through a contact hole penetrating the first via layer VIA1.

The second source metal layer SD2 may be formed as a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

The second via layer VIA2 may be located over the second source metal layer SD2. The second via layer VIA2 may be a second planarization layer for planarizing a step difference cause by the second source metal layer SD2, but the present disclosure is not limited thereto. Similarly to the first via layer VIA1, the second via layer VIA2 may be formed as a single layer or a multi-layer including an organic layer and/or an inorganic layer. The second via layer VIA2 may include/define an opening corresponding to the emission area EA.

In some embodiments, the second via layer VIA2 and the second source metal layer SD2 may be omitted.

The third source metal layer SD3 may be formed on the second via layer VIA2. The third source metal layer SD3 may include a first bridge electrode BRE1, a second bridge electrode BRE2, and the power line VSL. The first bridge electrode BRE1 may be connected to the first bridge pattern BRP1 through a contact hole penetrating the second via layer VIA2, and the second bridge electrode BRE2 may be connected to the second bridge pattern BRP2 through a contact hole penetrating the second via layer VIA2. A power voltage (e.g., a low power voltage or a driving power source) suitable for driving the sub-pixel SPX may be applied to the power line VSL.

The third source metal layer SD3 may be formed as a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

In embodiments, in the emission area EA, an opening OP may be formed, which exposes the substrate SUB while penetrating the buffer layer BF, the first gate insulating layer GI1, the second gate insulating layer GI2, the interlayer insulating layer ILD, the first via layer VIA1, and the second via layer VIA2 (e.g., the pixel circuit layer from the buffer layer BF to the second via layer VIA2). For example, the opening of the buffer layer BF, the opening of the first gate insulating layer GI1, the opening of the second gate insulating layer GI2, the opening of the interlayer insulating layer ILD, the opening of the first via layer VIA1, and the opening of the second via layer VIA2 may overlap with one another, thereby forming the opening OP. However, the present disclosure is not limited thereto. For example, the opening OP may be formed by collectively etching the buffer layer BF, the first gate insulating layer GI1, the second gate insulating layer GI2, the interlayer insulating layer ILD, the first via layer VIA1, and the second via layer VIA2. The method of forming the opening OP is not particularly limited.

The light conversion pattern LCP may be located or provided in the opening OP. For example, after the third source metal layer SD3 is formed, the light conversion pattern LCP may be formed in the opening OP. The light conversion pattern LCP may include color conversion particles QD and/or a color filter CF. For example, the light conversion pattern LCD may include the color filter CF, and further include color conversion particles QD. However, the present disclosure is not limited thereto. In another example, the light conversion pattern LCP may include only the color conversion particles QD.

The light conversion pattern LCP may change or convert a wavelength (or color) of light emitted from the light emitting element LD by using the color conversion particles QD (or quantum dots), and may allow light of a corresponding wavelength (or corresponding color) to be selectively transmitted therethrough by using the color filter CF. Light may be emitted to the outside (e.g., in the opposite direction of the third direction DR3) through the light conversion pattern LCP and the substrate SUB from the light emitting element LD. That is, the sub-pixel SPX (and the display device 10 (see FIG. 1) including the same) may have a bottom emission structure.

Meanwhile, although a case where a height of an upper surface of the light conversion pattern LCP and a height of an upper surface of the second via layer VIA2 are the same with respect to the substrate SUB has been illustrated in FIG. 7, the present disclosure is not limited thereto. For example, the height of the upper surface of the light conversion pattern LCP may be lower than the height of the upper surface of the second via layer VIA2. In another example, the height of the upper surface of the light conversion pattern LCP may be higher than the height of the upper surface of the second via layer VIA2. Also, although a case where the upper surface of the light conversion pattern LCP is flat has been illustrated in FIG. 7, the present disclosure is not limited thereto. For example, the upper surface of the light conversion pattern LCP may have a sectional shape concave toward the substrate SUB. The thickness and sectional shape of the light conversion pattern LCP is not particularly limited within a range in which the light conversion pattern LCP is located in the opening OP.

In the emission area EA, the light emitting element LD may be located on the light conversion pattern LCP. The light emitting element LD is depicted as a flip chip type micro LED in which a first contact electrode ELT1 and a second contact electrode ELT2 are located to face in the third direction DR3. The light emitting element LD may be formed of an inorganic material such as GaN. Each of a length of the light emitting element LD in the second direction DR2 (and a length of the light emitting element LD in the first direction DR1 (see FIG. 3)) and a length of the light emitting element LD in the third direction DR3 may be a few tens to a few hundreds of μm. For example, each of the length of the light emitting element LD in the second direction DR2 (and a length of the light emitting element LD in the first direction DR1) and the length of the light emitting element LD in the third direction DR3 may be about 100 μm or less. The light emitting element LD will be described later with reference to FIG. 8. Each of the light emitting elements LD1 to LD3 shown in FIG. 5 may correspond to the light emitting element LD, and may be substantially identical to one another.

The light emitting element LD may be formed by being grown on a semiconductor substrate such as a silicon wafer. The light emitting element LD may be transferred onto the light conversion pattern LCP from the silicon wafer. Alternatively, the light emitting element LD may be transferred onto the light conversion pattern LCP through an electrostatic process using an electrostatic head or a stamp process using, as a transfer substrate, a polymer material having elasticity, such as PDMS or silicon.

The third via layer VIA3 may be located over the third source metal layer SD3 and the light emitting element LD. The third via layer VIA3 may be a third planarization layer for planarizing a step difference caused by the third source metal layer SD3 and the light emitting element LD, but the present disclosure is not limited thereto. Similarly to the first via layer VIA1, the third via layer VIA3 may be formed as a single layer or a multi-layer, which includes an organic layer and/or an inorganic layer.

Although a case where the light emitting element LD is located in an opening of the third via layer VIA3 has been illustrated in FIG. 7, the present disclosure is not limited thereto. For example, with respect to the substrate SUB, a height of an upper surface of the third via layer VIA3 may be higher than a height of an upper surface of the light emitting element LD, and the third via layer VIA3 may substantially cover the light emitting element LD.

A connection electrode layer ITOL may be located on the third via layer VIA3. The connection electrode layer ITOL may include a first connection electrode CNE1 (or first pixel electrode) and a second connection electrode CNE2 (or second pixel electrode). The first connection electrode CNE1 may be designated as an anode electrode, and the second connection electrode CNE2 may be designated as a cathode electrode. However, the present disclosure is not limited thereto.

The first connection electrode CNE1 may be connected to the first bridge BRE1 through a contact hole penetrating the third via layer VIA3, and may be connected to the first contact electrode ELT1 exposed by the third via layer VIA3. The first connection electrode CNE1 may electrically connect the first contact electrode ELT1 of the light emitting element LD and the thin film transistor TFT to each other. Therefore, a pixel voltage or an anode voltage, which is controlled by the thin film transistor TFT, may be applied to the light emitting element LD.

Similarly, the second connection electrode CNE2 may be connected to the power line VSL through a contact hole penetrating the third via layer VIA3, and may be connected to the second contact electrode ELT2 exposed by the third via layer VIA3. The second connection electrode CNE2 may electrically connect the second contact electrode ELT2 of the light emitting element LD and the power line VSL to each other. Therefore, a power voltage of the power line VSL may be applied to the light emitting element LD.

The connection electrode layer ITOL may include a transparent conductive material (TCO) such as indium tin oxide (ITO) or indium zinc oxide (IZO), but the present disclosure is not limited thereto. For example, the connection electrode layer ITOL may include a metal material having a high reflexibility, such as a stacked structure of aluminum and titanium (Ti/Al/Ti), a stacked structure of aluminum and ITO (ITO/Al/ITO), an APC alloy, and a stacked structure of the APC alloy and ITO (ITO/APC/ITO). The APC alloy is an alloy of silver (Ag), palladium (Pd), and copper (Cu).

The fourth via layer VIA4 may be located over the connection electrode layer ITOL. The fourth via layer VIA4 may be a fourth planarization layer for planarizing a step difference caused by the connection electrode layer ITOL, but the present disclosure is not limited thereto. The fourth via layer VIA4 may cover the connection electrode layer ITOL and the light emitting element LD. Similarly to the first via layer VIA1, the fourth via layer VIA4 may be formed as a single layer or a multi-layer, which includes an organic layer and/or an inorganic layer.

The fourth source metal layer SD4 may be formed on the fourth via layer VIA4. The fourth source metal layer SD4 may include a fan-out line FOL and a pad PAD. The fan-out line FOL may be connected to the second bridge electrode BRE2 through a contact hole CH penetrating the fourth via layer VIA4 and the third via layer VIA3. The fan-out line FOL may be electrically connected to the data line DL. The pad PAD may be electrically connected to the fan-out line FOL. The pad PAD may be electrically connected to the data line DL through the fan-out line FOL. In some embodiments, the pad PAD may be integrally formed with the fan-out line FOL. For example, the pad PAD may be an end portion area of the fan-out line FOL, which is exposed by the protective layer PVX. On a plane, the pad PAD may be located while overlapping with the sub-pixel SPX (or the emission area EA).

The fourth source metal layer SD4 may be formed as a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

The protective layer PVX may be located over the fourth source metal layer SD4. The protective layer PVX may be formed as a single layer or a multi-layer, which includes an organic layer and/or an inorganic layer. The protective layer PVX may cover a lower member including the light emitting element LD. The protective layer PVX may reduce or prevent moisture or air infiltrating into the above-described lower member. Also, the protective layer PVX may protect the above-described lower member from a foreign matter such as dust.

A flexible film FPCB on which a source driving circuit SIC is mounted may be located on the protective layer PVX. The source driving circuit SIC may be connected to the pad PAD (e.g., the pad PAD exposed by the protective layer PVX) through the flexible film FPCB. The source driving circuit SIC may be electrically connected to the data line DL. Although a case where the source driving circuit SIC has a chip on film structure has been illustrated in FIG. 7, the present disclosure is not limited thereto.

As described above, the thin film transistor TFT and the light conversion pattern LCP is located in the substantially same layer, the light emitting element LD is located on the light conversion pattern LCP, and the pad PAD is located on the fourth via layer VIA4 covering the light emitting element LD. The pad PAD is connected to the source driving circuit SIC located at an uppermost portion of the display device 10 (see FIG. 2). That is, all components of the display device 10 may be formed on the one surface of the substrate SUB through a continuous process. As compared with a display device (e.g., a display device in which a pattern is formed on both surfaces of the substrate SUB) in accordance with comparative embodiments that will be described later with reference to FIG. 18, the yield of the display device 10 in which a pattern is formed only the one surface of the substrate SUB can be improved.

In addition, the display device 10 (or the sub-pixel SPX) includes the light conversion pattern LCP, so that a full-color image can be expressed by using only the light emitting element LD of a single color (e.g., a light emitting element emitting light of blue). The transfer efficiency of the light emitting element LD can be improved, as compared with the display device in accordance with the comparative embodiments including light emitting elements of several colors (accordingly, light emitting elements of several colors are individually transferred).

Further, the pad PAD (and the fan-out line FOL) is formed in an uppermost layer of the display device 10. In other words, any non-emission area or bezel for the pad PAD (and the fan-out line FOL) is unnecessary, so that a bezel-less display device can be implemented.

Figure 8:
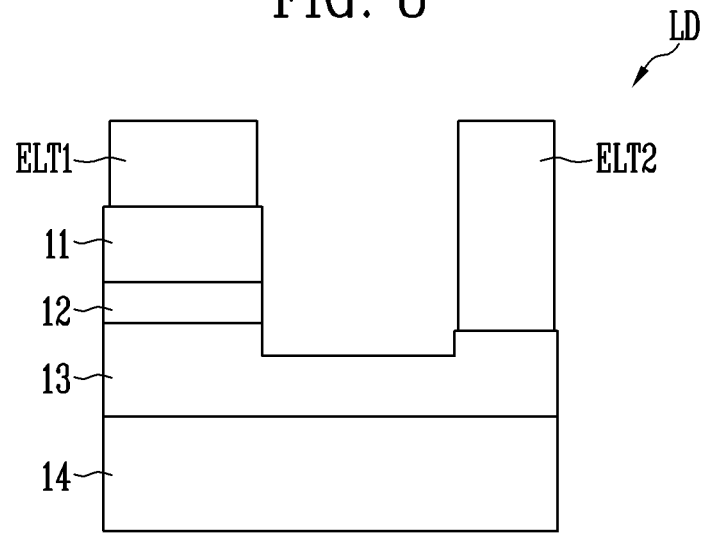
FIG. 8 is a view schematically illustrating a light emitting element included in the sub-pixel shown in FIG. 7.

FIG. 8 is a view schematically illustrating the light emitting element included in the sub-pixel shown in FIG. 7.

Referring to FIG. 8, the light emitting element LD may be a light emitting structure including a first semiconductor layer 11 (or first semiconductor), an active layer 12 (or light emitting layer), a second semiconductor layer 13 (or second semiconductor), a first contact electrode ELT1, and a second contact electrode ELT2. In some embodiments, the light emitting element LD may further include a base substrate 14 located at a lowermost portion. The base substrate 14 may be a sapphire substrate, but the present disclosure is not limited thereto.

The first semiconductor layer 11 may be located on one surface of the active layer 12. The first semiconductor layer 11 may be made of GaN doped with a p-type conductive dopant such as Mg, Zn, Ca, Se or Ba.

The active layer 12 may be located on a portion of one surface of the second semiconductor layer 13. The active layer 12 may include a material having a single quantum well structure or a multiple quantum well structure. When the active layer 12 includes the material having the multiple quantum well structure, the active layer 12 may have a structure in which a plurality of well layers and a plurality of barrier layers are alternately stacked. The well layer may be formed of InGaN, and the barrier layer may be formed of GaN or AlGaN. However, the present disclosure is not limited thereto. Alternatively, the active layer 12 may have a structure in which a semiconductor material having a high band gap energy and a semiconductor material having a low band gap energy are alternately stacked, and include other Group III to Group V semiconductor materials according to the wavelength band of emitted light.

When the active layer 12 includes InGaN, the color of emitted light may be changed according to a content of indium (In). For example, as the content of indium (In) increases, the wavelength band of light emitted from the active layer 12 may be moved to a red wavelength band. As the content of indium (In) decreases, the wavelength band of light emitted from the active layer 12 may be moved to a blue wavelength band. That is, a color (or wavelength band) of light emitted from the light emitting element LD may be determined according to the content of indium (In) of the active layer 12.

The second semiconductor layer 13 may be located on the other surface of the active layer 12 or be located between the active layer 12 and the base substrate 14. For example, the second semiconductor layer 13 may be made of GaN doped with an n-type conductive dopant such as Si, Ge or Sn.

The first contact electrode ELT1 may be located on one surface of the first semiconductor layer 11, and the second contact electrode ELT2 may be located on the one surface of the second semiconductor layer 13.

The first contact electrode ELT1 and the first connection electrode CNE1 may be adhered to each other through a conductive adhesive member such as an anisotropic conductive film (ACF) or an anisotropic conductive paste (ACP). Alternatively, the first contact electrode ELT1 and the first connection electrode CNE1 may be adhered to each other through a soldering process.

In embodiments, the light emitting element LD may have a mesa structure for the purpose of a flip chip type. For example, the light emitting element LD may have a mesa area in which the other of the first semiconductor layer 11 and the second semiconductor layer 13 is partially exposed by one of the first semiconductor layer 11 and the second semiconductor layer 13. For example, in the light emitting element LD, the first semiconductor layer 11 may have a shape protruding on the one surface of the second semiconductor layer 13, and the one surface of the second semiconductor layer 13, or a portion thereof, may be partially exposed by the first semiconductor layer 11. However, the present disclosure is not limited thereto.

Figure 9:
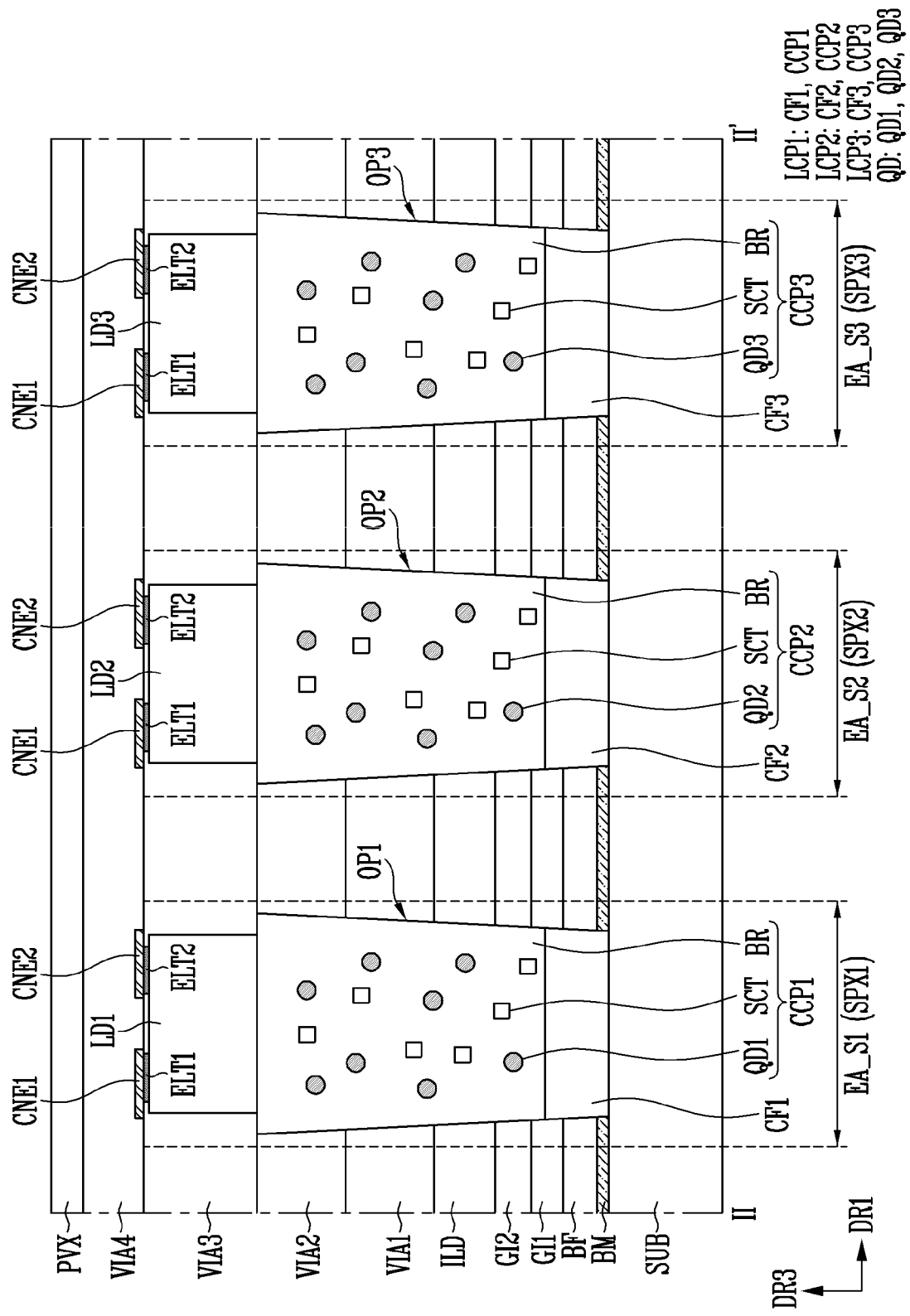
FIG. 9 is a sectional view schematically illustrating an example of the pixel taken along the line II-II' shown in FIG. 3.

FIG. 9 is a sectional view schematically illustrating an example of the pixel taken along the line II-II' shown in FIG. 3.

Referring to FIGS. 1 to 9, each of the sub-pixels SPX1 to SPX3 included in the pixel PX is substantially identical or similar to the sub-pixel SPX shown in FIG. 8, and therefore, overlapping descriptions will not be repeated.

The pixel PX may include light emitting elements LD1 to LD3 provided in sub-emission areas EA_S1 to EA_S3. For example, a first light emitting element LD1 may be provided in a first sub-emission area EA_S1, a second light emitting element LD2 may be provided in a second sub-emission area EA_S2, and a third light emitting element LD3 may be provided in a third sub-emission area EA_S3.

In embodiments, the light emitting elements LD1 to LD3 may emit light of the same single color (or wavelength band). For example, each of the light emitting elements LD1 to LD3 may be a blue light emitting elements for emitting blue light, but the present disclosure is not limited thereto.

In the first sub-emission area EA_S1, a first light conversion pattern LCP1 for the first sub-pixel SPX1 may be located or provided in an opening. The first light conversion pattern LCP1 may include a first color filter CF1 and a first color conversion pattern CCP1 located on the first color filter CF1. In the second sub-emission area EA_S2, a second light conversion pattern LCP2 for the second sub-pixel SPX2 may be located or provided in an opening. The second light conversion pattern LCP2 may include a second color filter CF2 and a second color conversion pattern CCP2 located on the second color filter CF2. In the third sub-emission area EA_S3, a third light conversion pattern LCP3 for the third sub-pixel SPX3 may be located or provided in an opening. The third light conversion pattern LCP3 may include a third color filter CF3 and a third color conversion pattern CCP3 located on the third color filter CF3.

The first, second, and third color conversion pattern CCP1, CCP2, and CCP3 may include a base resin BR, color conversion particles QD, and light scattering particles SCT.

The base resin BR may have a high light transmittance and an excellent dispersion characteristic for the color conversion particles QD. For example, the base resin BR may include an organic material, such as epoxy resin, acrylic resin, cardo resin, or imide resin.

The color conversion particles QD may convert light of a color (or wavelength band), which is emitted from the light emitting elements LD1 to LD3 (or the light emitting element LD (see FIG. 7)) into light of a corresponding color (or corresponding wavelength band). In an example, when the first sub-pixel SPX1 is a red pixel, the first color conversion pattern CCP1 may include first color conversion particles QD1 of a red quantum dot, which convert light emitted from the first light emitting element LD1 into light of red (or red wavelength band). In another example, when the second sub-pixel SPX2 is a green pixel, the second color conversion pattern CCP2 may include second color conversion particles QD2 of a green quantum dot, which convert light emitted from the second light emitting element LD2 into light of green (or green wavelength band). In still another example, when the third sub-pixel SPX3 is a blue pixel, the third color conversion pattern CCP3 may include third color conversion particles QD3 of a blue quantum dot, which convert light emitted from the third light emitting element LD3 into light of blue (or blue wavelength band). Alternatively, when the third light emitting element LD3 emits blue light, the third color conversion pattern CCP3 may not include the third color conversion particles QD3.

The color conversion particles QD may have shape such as a spherical shape, a pyramid shape, a multi-arm shape, a cubic nano particle, a nano wire, a nano fabric, or a nano plate particle. However, the present disclosure is not necessarily limited thereto, and the shape of the color conversion particles QD may be variously changed.

In one or more embodiments, light of blue having a relatively short wavelength in a visible light band is incident into the first and second color conversion particles QD1 and QD2, so that absorption coefficients of the first and second color conversion particles QD1 and QD2 can be increased. Accordingly, the efficiency of light finally emitted from the first sub-pixel SPX1 and the second sub-pixel SPX2 can be improved, and excellent color reproduction can be ensured. In addition, a pixel unit of the first to third sub-pixels SPX1, SPX2, and SPX3 is configured by using light emitting elements LD1 to LD3 of the same color (e.g., blue light emitting elements), so that the manufacturing efficiency of the display device can be improved.

The light scattering particles SCT may have a refractive index different from a refractive index of the base resin BR, and form an optical interface with the base resin BR. The light scattering particles SCT may be metal oxide particles or organic particles. In some embodiments, the light scattering particles SCT may be omitted.

In some embodiments, a capping layer may be located at an upper portion and/or a lower portion of each of the first, second, and third color conversion patterns CCP1, CCP2, and CCP3. The capping layer may seal (or cover) each of the first, second, and third color conversion patterns CCP1, CCP2, and CCP3, and may reduce or prevent the likelihood of the first, second, and third color conversion patterns CCP1, CCP2, and CCP3 being damaged or contaminated due to infiltration of an impurity (or solution used in a subsequent process), such as moisture or air from the outside. The capping layer may be configured as a single layer or a multi-layer including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the present disclosure is not limited thereto.

The color filters CF1 to CF3 may be located on the bottom of the color conversion patterns CCP1 to CCP3. The color filters CF1 to CF3 may include a color filter material for allowing light of a corresponding color, which is converted by the color conversion patterns CCP1 to CCP3, to be selectively transmitted therethrough. The color filters CF1 to CF3 may include a red color filter, a green color filter, and a blue color filter. In an example, when the first sub-pixel SPX1 is a red pixel, the first color filter CF1 that allows red light to be transmitted therethrough may be located on the bottom of the first color conversion pattern CCP1. When the second sub-pixel SPX2 is a green pixel, the second color filter CF2 that allows green light to be transmitted therethrough may be located on the bottom of the second color conversion pattern CCP2. When the third sub-pixel SPX2 is a blue pixel, the third color filter CF3 that allows blue light to be transmitted therethrough may be located on the bottom of the third color conversion pattern CCP3.

Although a case where the color filters CF1 to CF3 and the color conversion patterns CCP1 to CCP3 are in contact with each other has been illustrated in FIG. 9, the present disclosure is not limited thereto. In some embodiments, at least one component may be further included between the color filters CF1 to CF3 and the color conversion patterns CCP1 to CCP3. For example, the first light conversion pattern LCP1 may further include a low refractive layer located between the first color filter CF1 and the first color conversion pattern CCP1, and the low refractive layer may allow light provided from the first color conversion pattern CCP1 to be recycled by total reflection, thereby improving light efficiency (e.g., external quantum efficiency, or light emission efficiency). Each of the second light conversion pattern LCP2 and the third light conversion pattern LCP3 may also further include a refractive layer.

As described above, the pixel PX (or the display device 10 (see FIG. 3) may increase light emission efficiency and may ensure excellent color reproduction by using the color conversion particles QD. Also, the pixel PX (or the display device 10 (see FIG. 3) includes only light emitting elements LD1 to LD3 of the same color (e.g., blue light emitting elements), so that the manufacturing efficiency of the display device 10 can be improved.

Figure 10:
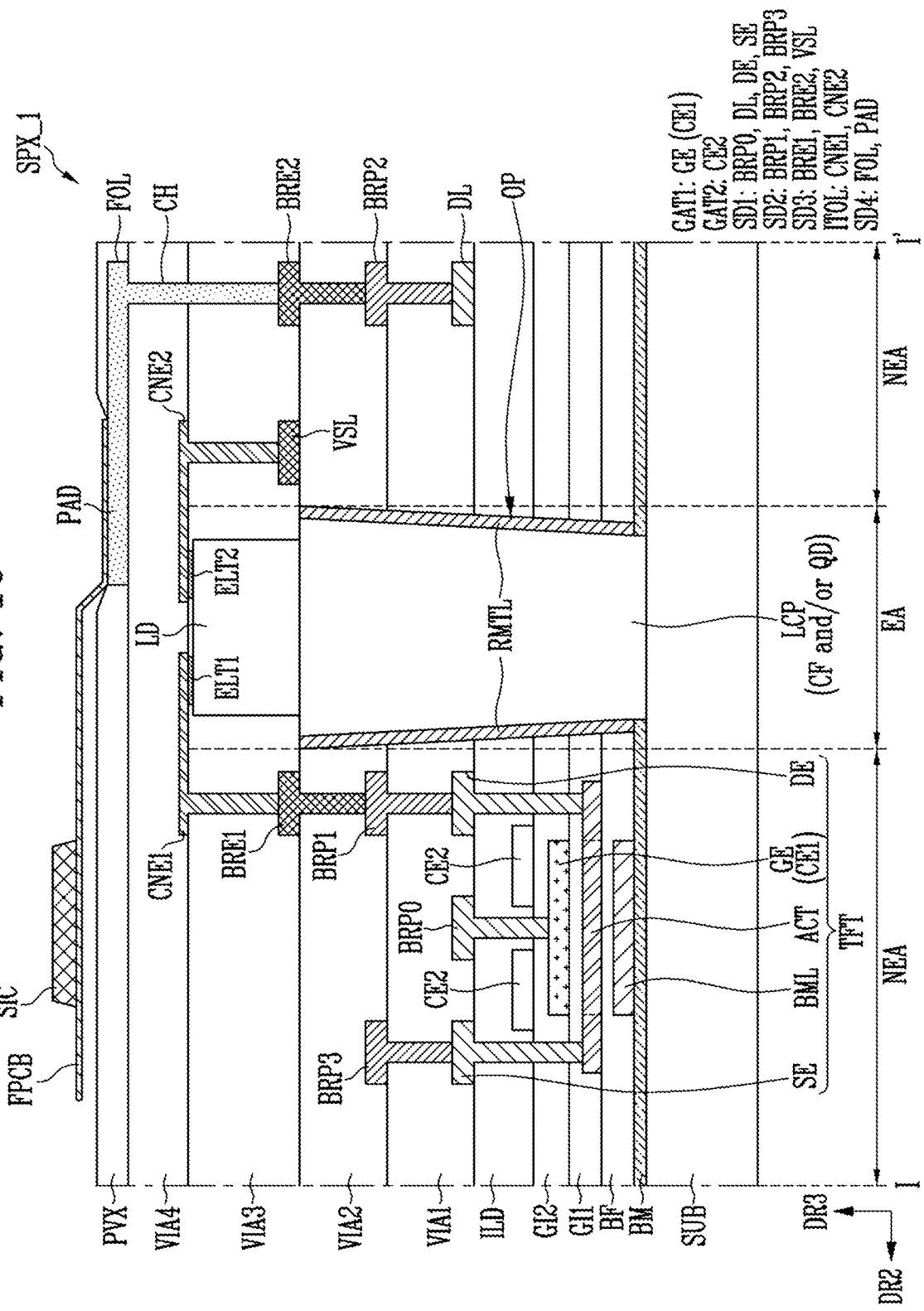
FIGS. 10 and 11 are sectional views schematically illustrating other examples of the sub-pixel taken along the line I-I' shown in FIG. 3.
Figure 11:
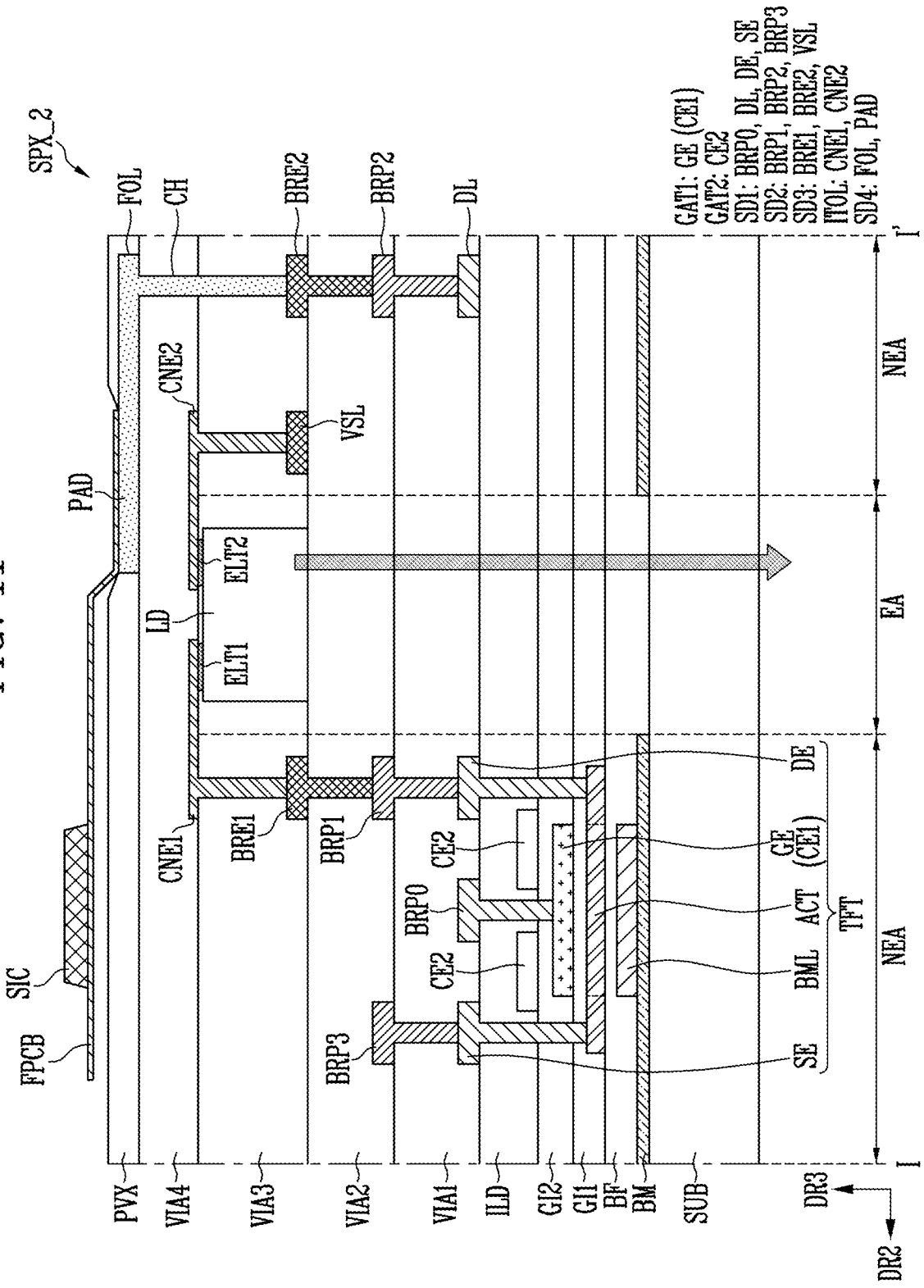

FIGS. 10 and 11 are sectional views schematically illustrating other examples of the sub-pixel taken along the line I-I' shown in FIG. 3.

Referring to FIGS. 3, 7, 10, and 11, each of a sub-pixel SPX1 shown in FIG. 10 and a sub-pixel SPX2 shown in FIG. 11 may be substantially identical or similar to the sub-pixel SPX shown in FIG. 7, except a reflective partition wall RMTL and the light conversion pattern LCP. Therefore, overlapping descriptions will not be repeated.

As shown in FIG. 10, the sub-pixel SPX1 may further include a reflective partition wall RMTL.

The reflective partition wall RMTL may be located or formed to cover at least a portion of a sidewall of/defined by the opening OP. The reflective partition wall RMTL may allow light emitted from the light emitting element LD to advance in an image display direction of the display device (e.g., the opposite direction of the third direction DR3). To this end, the reflective partition wall RMTL may be configured with a material having a constant reflexibility. For example, the reflective partition wall RMTL may include an opaque metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or any alloy thereof.

In one or more embodiments, the reflective partition wall RMTL may be formed by using at least one of the first gate layer GAT1, the second gate layer GAT2, the first source metal layer SD1, the second source metal layer SD2, and the third source metal layer SD3. For example, after the opening is formed in the second via layer VIA2, the reflective partition wall RMTL may be formed by using only the third source metal layer SD3. In another example (similar to the second transistor electrode DE, the first bridge pattern BRP1, and the first bridge pattern BRE1), the reflective partition wall RMTL may be formed by using the first source metal layer SD1, the second source metal layer SD2, and the third source metal layer SD3.

A structure configured with the second transistor electrode DE, the first bridge pattern BRP1, and the first bridge electrode BRE1, for example, the structure located adjacent to the opening OP may perform the same function as the reflective partition wall RMTL. The reflective partition wall RMTL may be omitted.

As shown in FIG. 11, the sub-pixel SPX2 may omit the light conversion pattern LCP (see FIG. 7). According to product specifications, the color filter CF (see FIG. 7) for reducing or preventing external light reflection, and the color conversion particles QD (see FIG. 7) for improving light emission efficiency, may be omitted. The light emitting element LD may emit lights of different colors for each sub-pixel SPX2. An example will be described with reference to FIG. 3. The light emitting element LD of the first sub-pixel SPX1 may emit light of a first color (e.g., red), the light emitting element LD of the second sub-pixel SPX2 may emit light of a second color (e.g., green), and the light emitting element LD of the third sub-pixel SPX3 may emit light of a third color (e.g., blue). The yield of the display device 10 (see FIG. 3) in which a pattern is formed on only one surface of the substrate SUB can be improved, and a bezel-less display device can be implemented.

Figure 12:
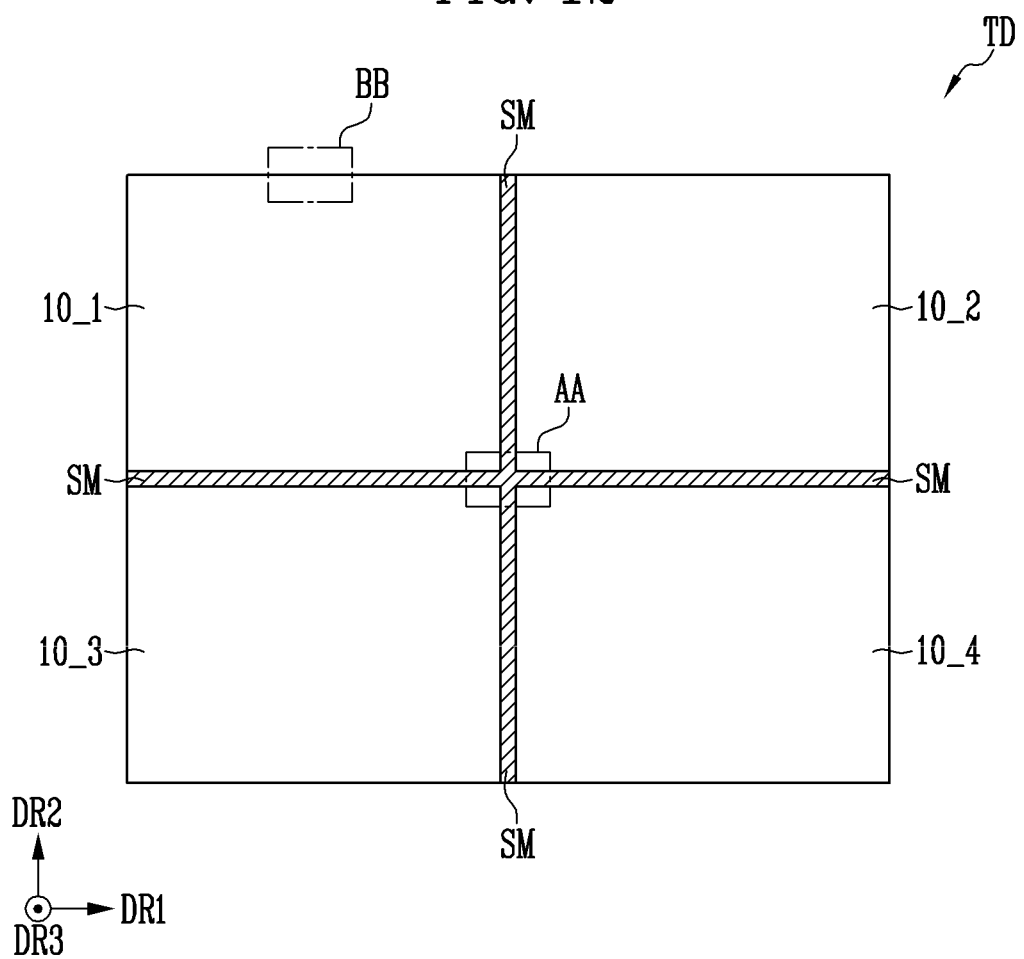
FIG. 12 is a perspective view illustrating a tiled display device including a plurality of display devices in accordance with one or more embodiments of the present disclosure.

FIG. 12 is a perspective view illustrating a tiled display device including a plurality of display devices in accordance with one or more embodiments of the present disclosure.

Referring to FIG. 12, the tiled display device TD may include a plurality of display devices 10_1 to 10_4, and a joining part SM. For example, the tiled display device TD may include a first display device 10_1, a second display device 102, a third display device 10_3, and a fourth display device 10_4.

The display devices 10_1 to 104 may be arranged in a lattice form. The display devices display devices 10_1 to 10_4 may be arranged in a matrix form on M rows and N columns. For example, the first display device 10_1 and the second display device 10_2 may be adjacent to each other in the first direction DR1. The first display device 10_1 and the third display device 10_3 may be adjacent to each other in the second direction DR2. The third display device 10_3 and the fourth display device 10_4 may be adjacent to each other in the first direction DR1. The second display device 10_2 and the fourth display device 10_4 may be adjacent to each other in the second direction DR2.

However, the number and arrangement of the display devices 10_1 to 10_4 in the tiled display device TD are not limited to those shown in FIG. 12. The number and arrangement of the display devices 10_1 to 10_4 in the tiled display device TD may be determined according to a size of each of the display device 10 and the tiled display device TD and a shape of the tiled display device TD.

The display devices 10_1 to 104 may have the same size, but the present disclosure is not limited thereto. For example, in some embodiments, the display devices 10_1 to 10_4 may have different sizes.

Each of the display devices 10_1 to 104 may have a rectangular shape including long sides and short sides. The display devices 10_1 to 10_4 may be located such that long sides or short sides are connected to each other. Some or all of the display devices 10_1 to 10_4 may be located at an edge of the tiled display device TD, and may form one side of the tiled display device TD. At least one display device among the display devices 10_1 to 10_4 may be located at at least one corner of the tiled display device TD, and may form two adjacent sides of the tiled display device TD. At least one display device among the display devices 10_1 to 10_4 may be surrounded by other display devices.

Each of the display devices 10_1 to 104 may be substantially identical to the display device 10 described in conjunction with FIGS. 1 to 6. Therefore, repeated descriptions of each of the display devices 10_1 to 10_4 will be omitted.

The joining part SM may include a coupling member or an adhesive member. The display devices 10_1 to 10_4 may be connected to each other through the coupling member or the adhesive member of the joining part SM. The joining part SM may be located between the first display device 10_1 and the second display device 10_2, between the first display device 10_1 and the third display device 10_3, between the second display device 10_2 and the fourth display device 10_4, and between the third display device 10_3 and the fourth display device 10_4.

Figure 13:
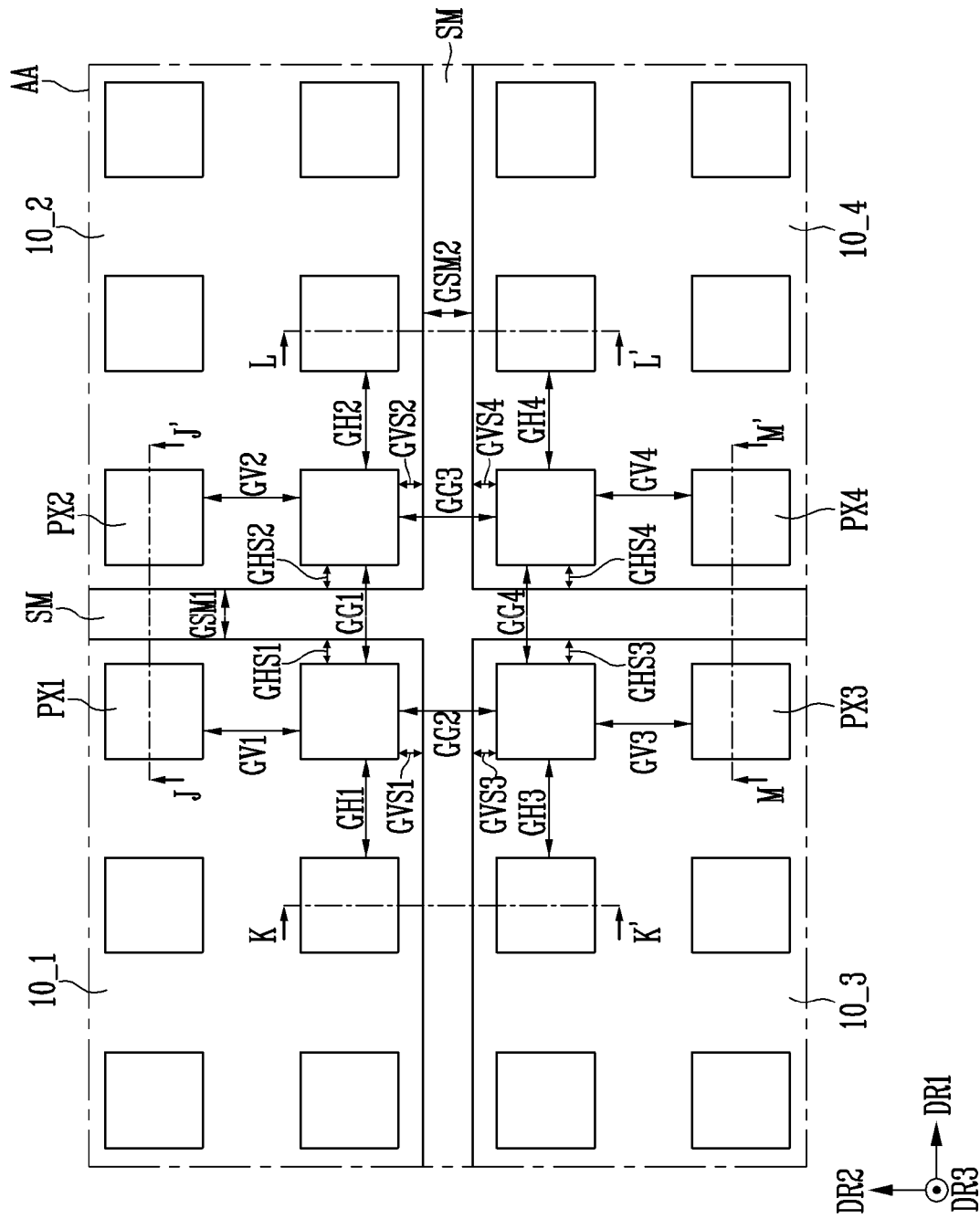
FIG. 13 is an enlarged layout view illustrating in detail area AA shown in FIG. 12.

FIG. 13 is an enlarged layout view illustrating in detail area AA shown in FIG. 12.

Referring to FIG. 13, the joining part SM may have a planar shape of a cross, or plus sign, in a central area of the tiled display device TD, in which the first display device 10_1, the second display device 102, the third display device 10_3, and the fourth display device 10_4 are adjacent to each other. The joining part SM may be located between the first display device 10_1 and the second display device 10_2, between the first display device 10_1 and the third display device 10_3, between the second display device 10_2 and the fourth display device 10_4, and between the third display device 10_3 and the fourth display device 10_4.

The first display device 10_1 may include first pixels PX1 arranged in a matrix form in the first direction DR1 and in the second direction DR2 to display an image. The second display device 10_2 may include second pixels PX2 arranged in a matrix form in the first direction DR1 and in the second direction DR2 to display an image. The third display device 10_3 may include third pixels PX3 arranged in a matrix form in the first direction DR1 and in the second direction DR2 to display an image. The fourth display device 10_4 may include fourth pixels PX4 arranged in a matrix form in the first direction DR1 and in the second direction DR2 to display an image. Each of the pixels PX1 to PX4 may be substantially identical or similar to the pixel PX described with reference to FIGS. 3 and 4.

A minimum distance between first pixels PX1 adjacent to each other in the first direction DR1 may be defined as a first horizontal separation distance GH1, and a minimum distance between second pixels PX2 adjacent to each other in the first direction DR1 may be defined as a second horizontal separation distance GH2. The first horizontal separation distance GH1 and the second horizontal separation distance GH2 may be substantially the same.

The joining part SM may be located between a first pixel PX1 and a second pixel PX2, which are adjacent to each other in the first direction DR1. A minimum distance GG1 between the first pixel PX1 and the second pixel PX2, which are adjacent to each other in the first direction DR1, may be a sum of a minimum distance GHS1 between the first pixel PX1 and the joining part SM in the first direction DR1, a minimum distance GHS2 between the second pixel PX2 and the joining part SM in the first direction DR1, and a width GSM1 of the joining part SM in the first direction DR1.

The minimum distance GG1 between the first pixel PX1 and the second pixel PX2, which are adjacent to each other in the first direction DR1, the first horizontal separation distance GH1, and the second horizontal separation distance GH2 may be substantially the same. To this end, the minimum distance GHS1 between the first pixel PX1 and the joining part SM in the first direction DR1 (e.g., a distance from a first pixel PX1 located at an outermost portion of the first display device 10_1 to an edge of the first display device 10_1) may be smaller than the first horizontal separation distance GH1, and the minimum distance GHS2 between the second pixel PX2 and the joining part SM in the first direction DR1 may be smaller than the second horizontal separation distance GH2. In addition, the width GSM1 of the joining part SM in first direction DR1 may be smaller than the first horizontal separation distance GH1 or the second horizontal separation distance GH2.

A minimum distance between third pixels PX3 adjacent to each other in the first direction DR1 may be defined as a third horizontal separation distance GH3, and a minimum distance between fourth pixels PX4 adjacent to each other in the first direction DR1 may be defined as a fourth horizontal separation distance GH4. The third horizontal separation distance GH3 and the fourth horizontal separation distance GH4 may be substantially the same.

The joining part SM may be located between a third pixel PX3 and a fourth pixel PX4, which are adjacent to each other in the first direction DR1. A minimum distance GG4 between the third pixel PX3 and the fourth pixel PX4, which are adjacent to each other in the first direction DR1, may be a sum of a minimum distance GHS3 between the third pixel PX3 and the joining part SM in the first direction DR1, a minimum distance GHS4 between the fourth pixel PX4 and the joining part SM in the first direction DR1, and the width GSM1 of the joining part SM in the first direction DR1.

The minimum distance GG4 between the third pixel PX3 and the fourth pixel PX4, which are adjacent to each other in the first direction DR1, the third horizontal separation distance GH3, and the fourth horizontal separation distance GH4 may be substantially the same. To this end, the minimum distance GHS3 between the third pixel PX3 and the joining part SM in the first direction DR1 may be smaller than the third horizontal separation distance GH3, and the minimum distance GHS4 between the fourth pixel PX4 and the joining part SM in the first direction DR1 may be smaller than the fourth horizontal separation distance GH4. In addition, the width GSM1 of the joining part SM in first direction DR1 may be smaller than the third horizontal separation distance GH3 or the fourth horizontal separation distance GH4.

A minimum distance between first pixels PX1 adjacent to each other in the second direction DR2 may be defined as a first vertical separation distance GV1, and a minimum distance between third pixels PX3 adjacent to each other in the second direction DR2 may be defined as a third vertical separation distance GV3. The first vertical separation distance GV1 and the third vertical separation distance GV3 may be substantially the same.

The joining part SM may be located between a first pixel PX1 and a third pixel PX3, which are adjacent to each other in the second direction DR2. A minimum distance GG2 between the first pixel PX1 and the third pixel PX3, which are adjacent to each other in the second direction DR2, may be a sum of a minimum distance GVS1 between the first pixel PX1 and the joining part SM in the second direction DR2, a minimum distance GVS3 between the third pixel PX3 and the joining part SM in the second direction DR2, and a width GSM2 of the joining part SM in the second direction DR2.

The minimum distance GG2 between the first pixel PX1 and the third pixel PX3, which are adjacent to each other in the second direction DR2, the first vertical separation distance GV1, and the third vertical separation distance GV3 may be substantially the same. To this end, the minimum distance GVS1 between the first pixel PX1 and the joining part SM in the second direction DR2 may be smaller than the first vertical separation distance GV1, and the minimum distance GVS3 between the third pixel PX3 and the joining part SM in the second direction DR2 may be smaller than the third vertical separation distance GV3. In addition, the width GSM2 of the joining part SM in the second direction DR2 may be smaller than the first vertical separation distance GV1 or the third vertical separation distance GV3.

A minimum distance between second pixels PX2 adjacent to each other in the second direction DR2 may be defined as a second vertical separation distance GV2, and a minimum distance between fourth pixels PX4 adjacent to each other in the second direction DR2 may be defined as a fourth vertical separation distance GV4. The second vertical separation distance GV2 and the fourth vertical separation distance GV4 may be substantially the same.

The joining part SM may be located between a second pixel PX2 and a fourth pixel PX4, which are adjacent to each other in the second direction DR2. A minimum distance GG3 between the second pixel PX2 and the fourth pixel PX4, which are adjacent to each other in the second direction DR2, may be a sum of a minimum distance GVS2 between the second pixel PX2 and the joining part SM in the second direction DR2, a minimum distance GVS4 between the fourth pixel PX4 and the joining part SM in the second direction DR2, and the width GSM2 of the joining part SM in the second direction DR2.

The minimum distance GG3 between the second pixel PX2 and the fourth pixel PX4, which are adjacent to each other in the second direction DR2, the second vertical separation distance GV2, and the fourth vertical separation distance GV4 may be substantially the same. To this end, the minimum distance GVS2 between the second pixel PX2 and the joining part SM in the second direction DR2 may be smaller than the second vertical separation distance GV2, and the minimum distance GVS4 between the fourth pixel PX4 and the joining part SM in the second direction DR2 may be smaller than the fourth vertical separation distance GV4. In addition, the width GSM2 of the joining part SM in the second direction DR2 may be smaller than the second vertical separation distance GV2 or the fourth vertical separation distance GV4.

As shown in FIG. 13, in order to allow the joining part SM not to be viewed between respective images displayed by the display devices 10_1 to 104, a minimum distance between pixels of display devices adjacent to each other may be substantially the same as a minimum distance between pixels of each of the display devices.

Figure 14:
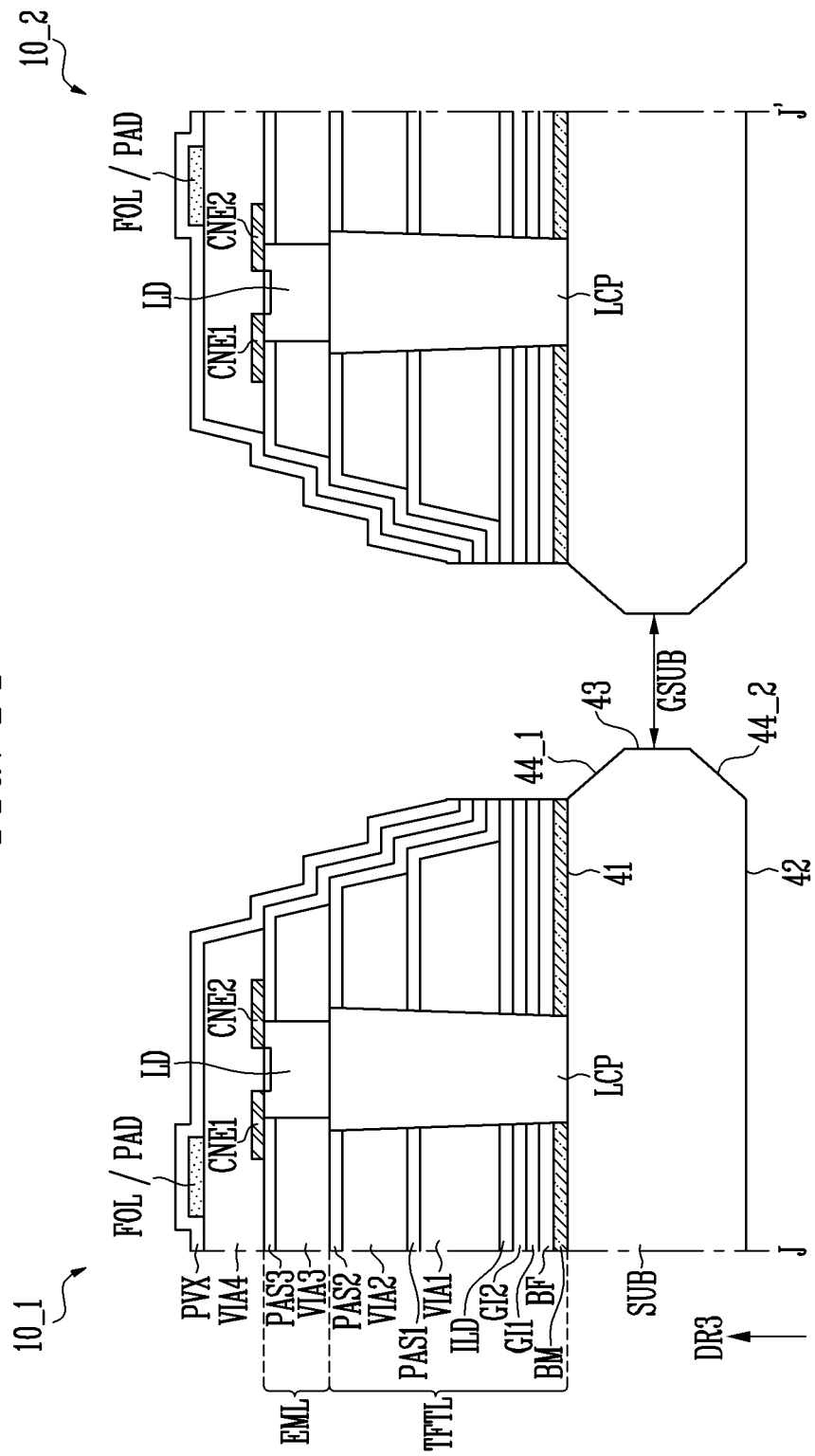
FIG. 14 is a sectional view illustrating an example of the tiled display device taken along the line J-J' shown in FIG. 13.

FIG. 14 is a sectional view illustrating an example of the tiled display device taken along the line J-J' shown in FIG. 13.

Referring to FIG. 14, each of the first display device 10_1 and the second display device 10_2 includes a substrate SUB, a thin film transistor layer TFTL (or pixel circuit layer), and a light emitting element layer EML. The thin film transistor layer TFTL and the light emitting element layer EML have been described in detail in conjunction with FIG. 7. In FIG. 14, descriptions overlapping with those of FIG. 7 will be omitted.

The thin film transistor layer TFTL may further include a first protective layer PAS1 and a second protective layer PAS2, and the light emitting element layer EML may include a third protective layer PAS3. The first protective layer PAS1 may be located on the first via layer VIA1, the second protective layer PAS2 may be located on the second via layer VIA2, and the third protective layer PAS3 may be located on the third via layer VIA3. When each of the first, second, and third via layers VIA1, VIA2, and VIA3 are formed as an organic layer, each of the first, second, and third protective layers PAS1, PAS2, and PAS3 may be formed as an inorganic layer (e.g., a silicon nitride layer, a silicon oxynitride layer, a silicon oxide layer, a titanium oxide layer, or an aluminum oxide layer).

The substrate SUB may include a first surface 41 on which the thin film transistor layer TFTL is located, a second surface 42 facing the first surface 41, and a first side surface 43 located between the first surface 41 and the second surface 42. The first surface 41 may be a front surface or a top surface of the substrate SUB, and the second surface 42 may be a rear surface or a bottom surface of the substrate SUB.

Also, the substrate SUB may further include chamfered surfaces 44_1 and 44_2 located between the first surface 41 and the first side surface 43 and between the second surface 42 and the first side surface 43, respectively. The thin film transistor layer TFTL and the light emitting element layer EML may not be located on the chamfered surfaces 44_1 and 44_2. Due to the chamfered surfaces 44_1 and 44_2, the likelihood of a substrate SUB of the first display device 10_1 and a substrate SUB of the second display device 10_2 being damaged while colliding with each other can be reduced or prevented.

The chamfered surfaces 44_1 and 44_2 may be located even between other side surfaces except the first surface 41 and the first side surface 43 and between other surfaces except the second surface 42 and the first side surface 43. For example, when the first display device 10_1 and the second display device 10_2 have a planar shape of a rectangle, as shown in FIG. 12, the chamfered surfaces 44_1 and 44_2 may be located between the first surface 41 and each of a second side surface, a third side surface, and a fourth side surface, and between the second surface 42 and each of the second side surface, the third side surface, and the fourth side surface.

In some embodiments, at least one functional layer may be located on the bottom of the substrate SUB. For example, the functional layer may be attached to the bottom of the substrate SUB through a transparent adhesive member, such as an optically clear adhesive film or an optically clear adhesive resin. For example, the functional layer may include an anti-glare layer and/or a light transmittance adjusting layer. The anti-glare layer may be designed such that external light is diffusely reflected so as to reduce or prevent the visibility of an image from being deteriorated as the external light is reflected as it is. The contrast ratio of an image displayed by the first display device 10_1 and the second display device 102 may be increased by the anti-glare layer. The light transmittance adjusting layer may be designed to decrease the transmittance of external light or light reflected from the first display device 10_1 and the second display device 10_2. Visibility of a distance GSUB between the substrate SUB of the first display device 10_1 and the substrate SUB of the second display device 10_2 from the outside can be reduced or prevented. The anti-glare layer may be implemented as a polarizing plate, and the light transmittance adjusting layer may be implemented as a retardation layer. However, the present disclosure is not limited thereto.

Meanwhile, examples of the tiled display device taken along the lines K-K', L-L', and M-M' are substantially identical to the example of the tiled display device taken along the line J-J', which is described in conjunction with FIG. 14, and therefore, their descriptions will be omitted.

Figure 15:
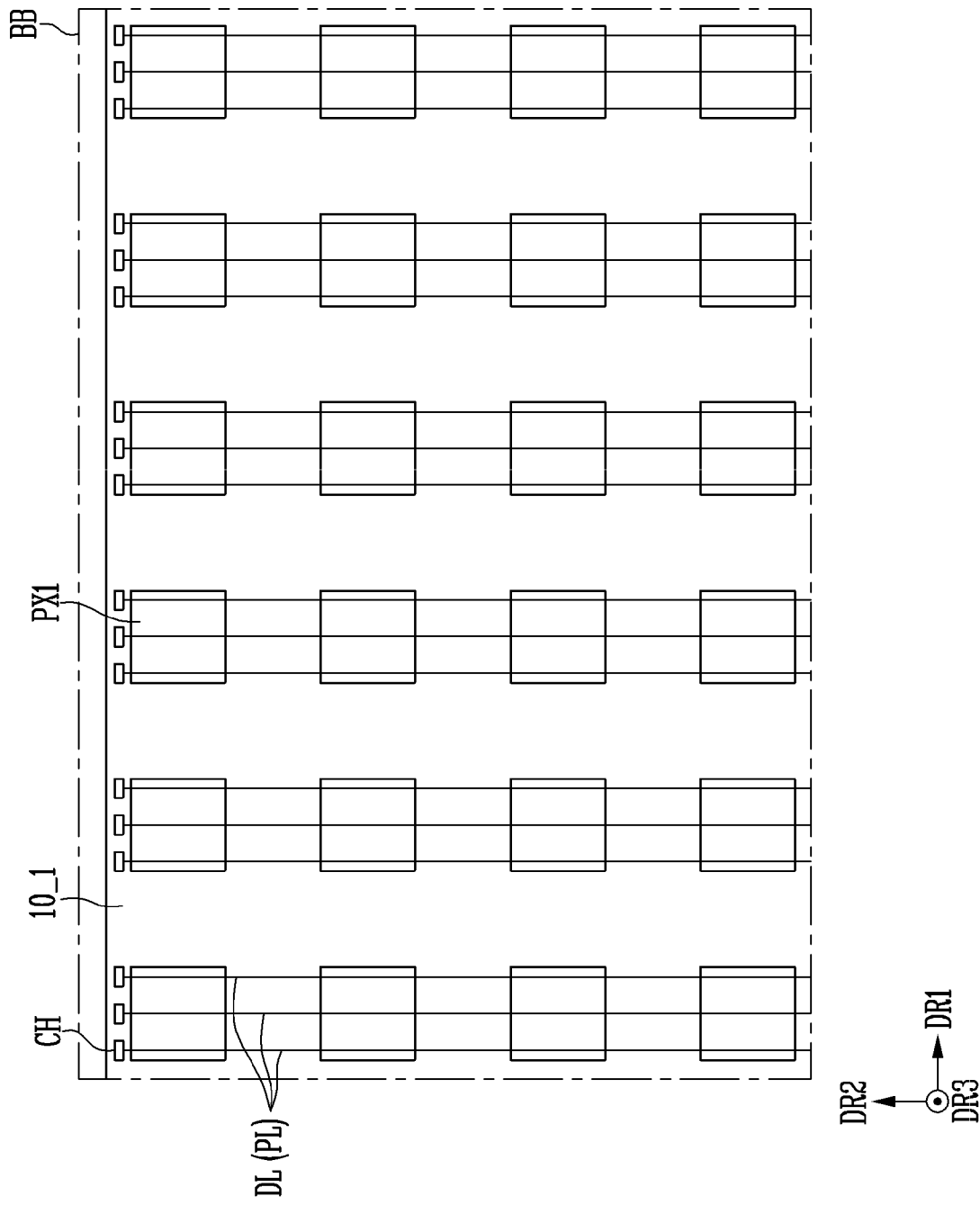
FIGS. 15 and 16 are enlarged layout views illustrating area BB shown in FIG. 12.
Figure 16:
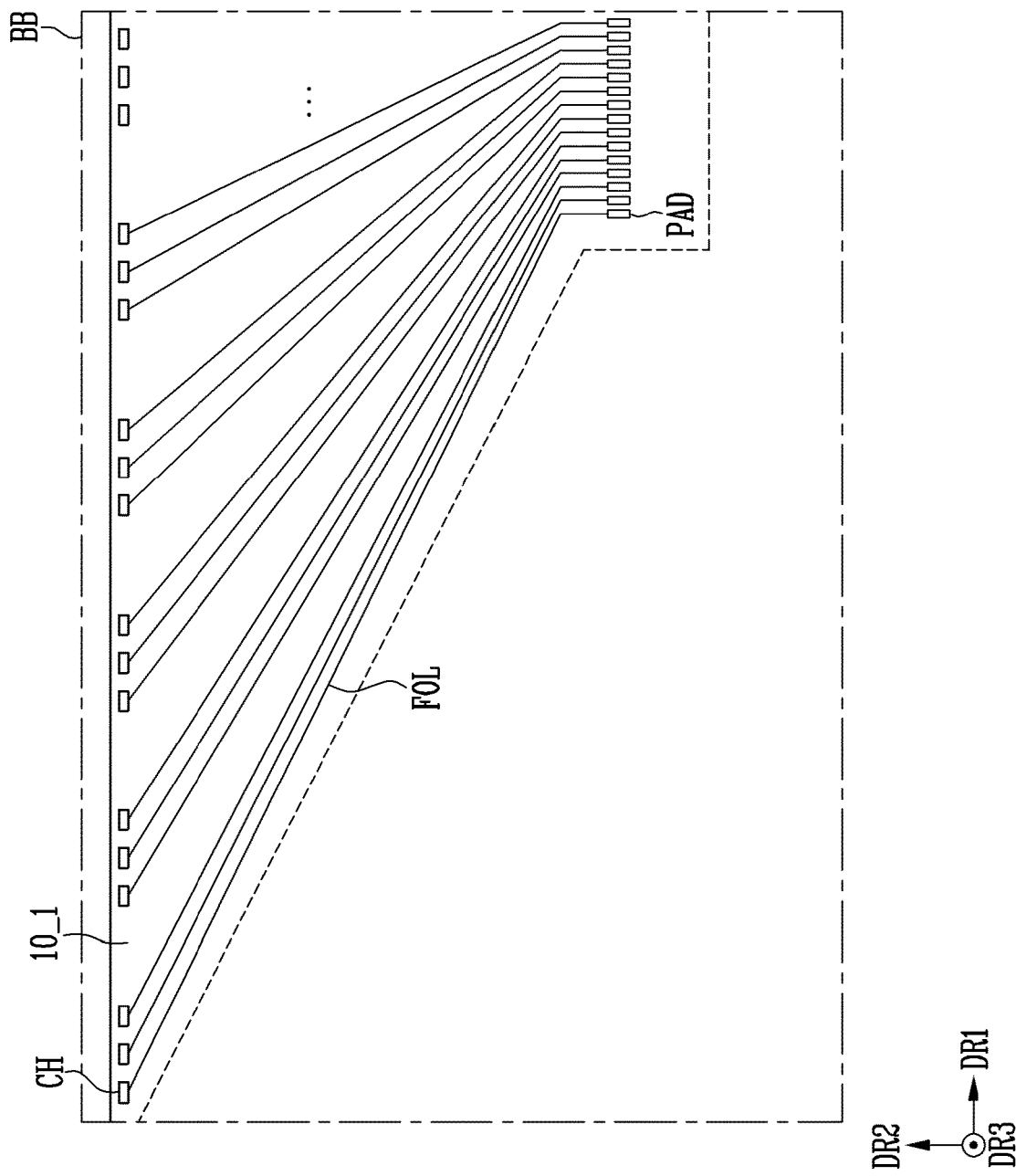

FIGS. 15 and 16 are enlarged layout views illustrating area BB shown in FIG. 12. In FIG. 15, the first display device 10_1 is schematically illustrated based on the thin film transistor layer TFTL shown in FIG. 14. In FIG. 16, the first display device 10_1 is schematically illustrated based on components (e.g., a fan-out line FOL and a pad PAD) on the top of the light emitting element layer EML shown in FIG. 14. For convenience of description, first pixels PXL are illustrated. The second display device 10_2, the third display device 10_3, and the fourth display device 10_4 have the substantially same configuration as the first display device 10_1, and therefore, overlapping descriptions will be omitted.

Referring to FIGS. 15 and 16, contact holes CH may be located at an upper edge of the first display device 10_1. When a data line DL (e.g., a power supply line, or another signal line) of the first display device 10_1 extends in the second direction DR2, the contact holes CH may be upper and lower edges of the first display device 10_1. Alternatively, when the data line DL of the first display device 10_1 extends in the first direction DR1, the contact holes CH may be located at left and right edges of the first display device 10_1. However, this is merely illustrative, and the positions of contact holes CH are not limited thereto. The positions of contact holes CH may be freely changed within a range overlapping with or connected to the data line DL.

As shown in FIG. 16, the fan-out line FOL and the pad PAD may be located in an uppermost layer of the first display device 10_1. The pad PAD may be located in one area (e.g., a central area) of the first display device 10_1, and the fan-out line FOL may extend from the pad PAD to the contact hole CH. The fan-out line FOL may electrically connect the data line DL (e.g., the power supply line PL, or the another signal line) and the pad PAD to each other through the contact hole CH.

Figure 17:
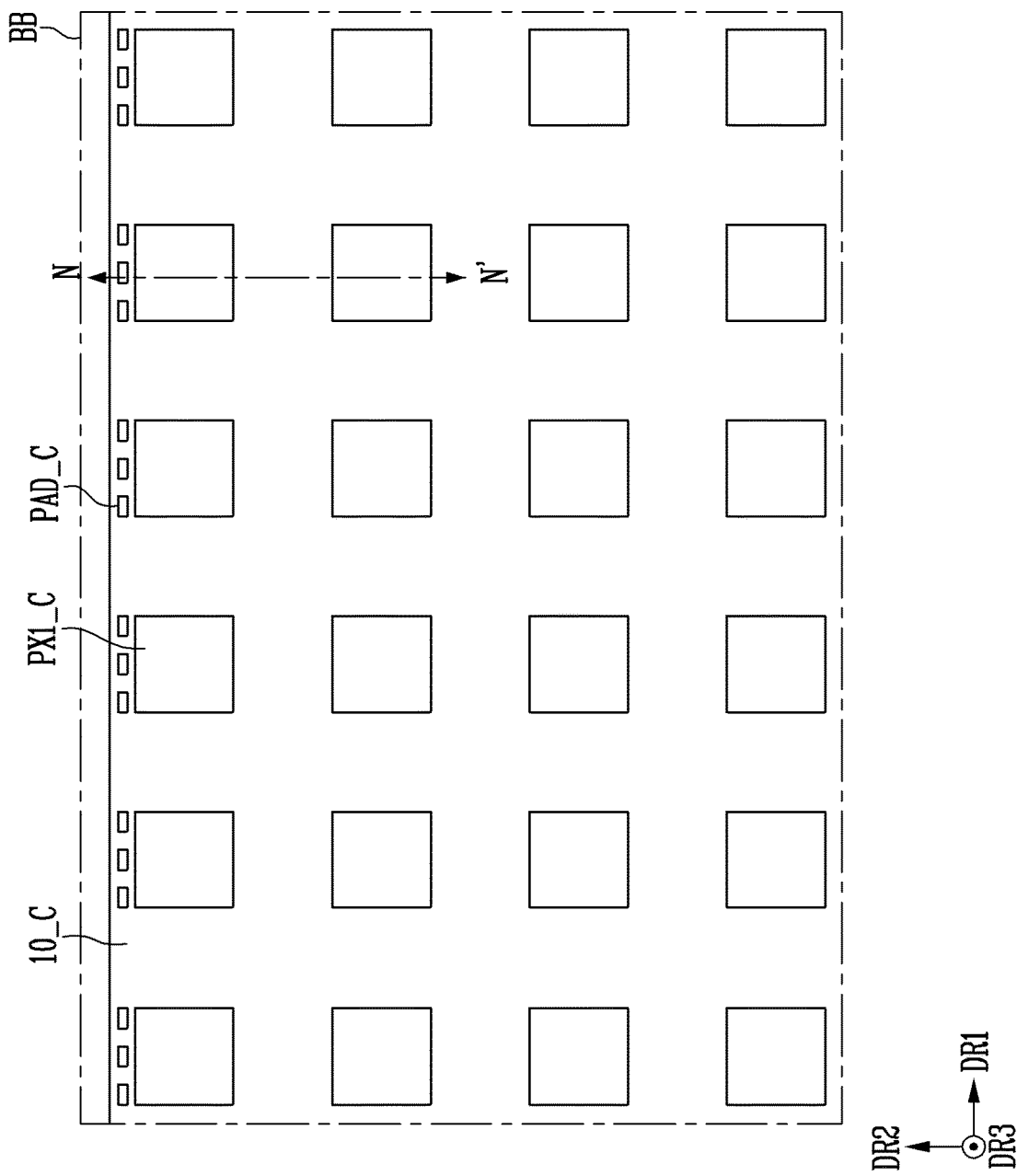
FIG. 17 is an enlarged layout view illustrating the area BB shown in FIG. 12 in a display device in accordance with comparative embodiments.

FIG. 17 is an enlarged layout view illustrating the area BB shown in FIG. 12 in a display device in accordance with comparative embodiments. For convenience of description, pads PAD_C and first pixels PX1_C, which are located at an upper side of the display device 10_C in accordance with the comparative embodiments, are illustrated in FIG. 17.

Referring to FIG. 17, pads PAD_C may be located at an upper edge of the display device 10_C in accordance with the comparative embodiments.

Each pad PAD_C may be connected to a data line on a top surface of a substrate SUB. Also, each pad PAD_C may be connected to a side surface line (see "SSL" shown in FIG. 18). The side surface line SSL may be located on the top surface, one side surface, and a bottom surface (or back surface) of the substrate SUB. The side surface line SSL may be connected to a lower connection line (see "CCL" shown in FIG. 18) on the bottom surface of the substrate SUB.

Figure 18:
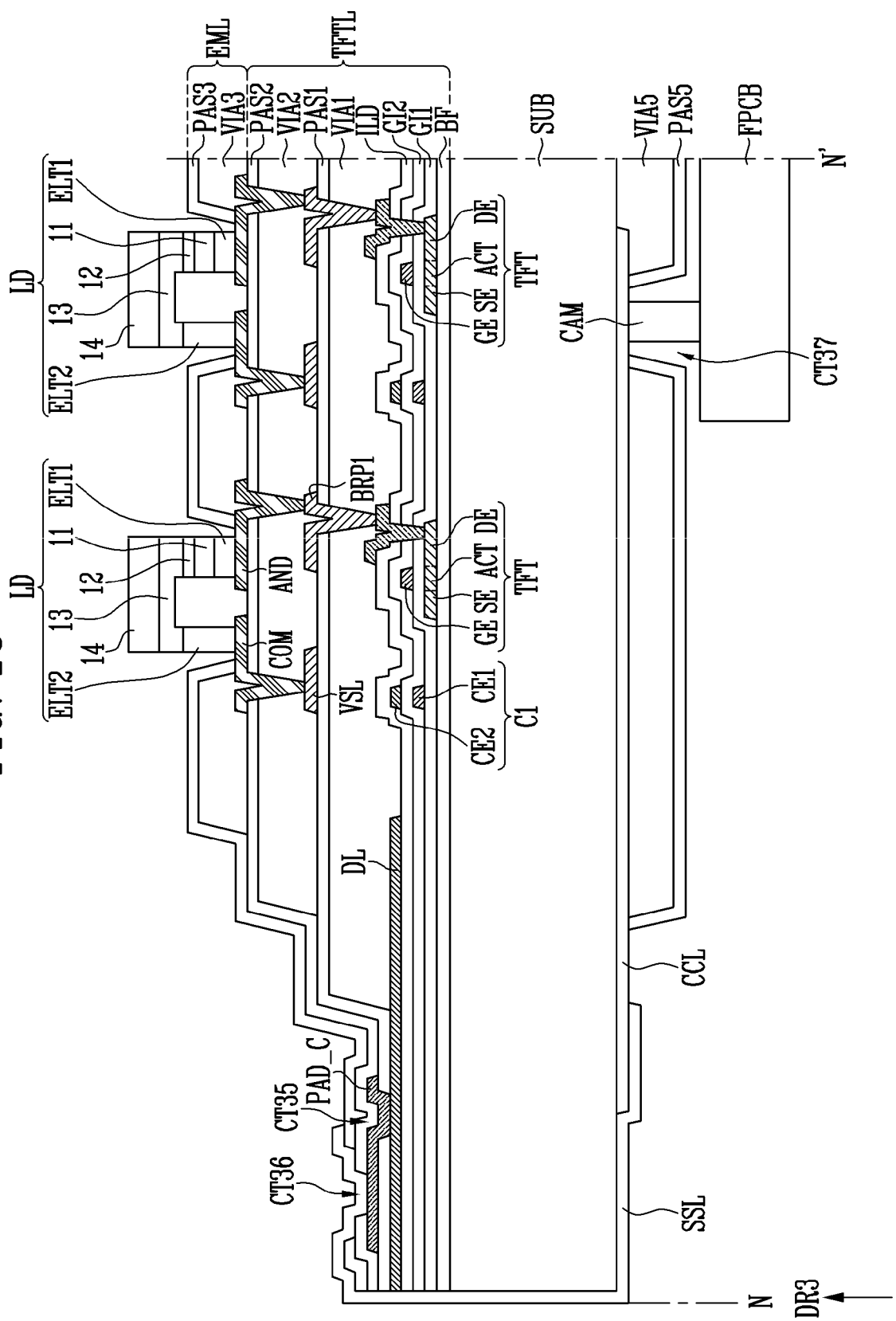
FIG. 18 is a sectional view illustrating the display device taken along the line N-N' shown in FIG. 17 in accordance with the comparative embodiments.

FIG. 18 is a sectional view illustrating the display device 10_C taken along the line N-N' shown in FIG. 17 in accordance with the comparative embodiments. In FIG. 18, components identical to those of the sectional views shown in FIGS. 14 and 7 are designated like reference numerals, and descriptions overlapping with those of FIGS. 14 and 7 will be omitted.

Referring to FIG. 18, a pixel electrode AND (or first pixel electrode) and a common electrode COM (or second pixel electrode) may be located on the second protective layer PAS2. The pixel electrode AND and the common electrode COM may respectively correspond to the first connection electrode CNE1 and the second connection electrode CNE2, which are shown in FIG. 7.

A light emitting element LD may be located on the pixel electrode AND and the common electrode COM, which are not covered by the third via layer VIA3 and the third protective layer PAS3.

The pad PAD_C may be located on the first protective layer PAS1. A portion of the pad PAD_C is not covered by the second protective layer PAS2 and the third protective layer PAS3, and instead may be exposed. The pad PAD_C may include the same material as the pixel electrode AND and the common electrode COM.

The pad PAD_C may be connected to the data line DL through a thirty-fifth contact hole CT35 penetrating the first protective layer PAS1. The pad PAD_C is located at an edge of the display device 10_C, and does not overlap with the light emitting element LD.

A lower connection line CCL may be located on the bottom surface of the substrate SUB. The lower connection line CCL may be formed as a single layer or a multi-layer, which is made of any one of molybdenum (Mo), aluminum (Al), chromium (Cr), gold (Au), titanium (Ti), nickel (Ni), neodymium (Nd), and copper (Cu), or any alloy thereof.

A fifth via layer VIA5 may be located on a portion of the lower connection line CCL. The fifth via layer VIA5 may be formed as an organic layer, such as acrylic resin, epoxy resin, phenolic resin, polyamide resin, or polyimide resin.

A fifth protective layer PAS5 may be located on/below the fifth via layer VIA5. The fifth protective layer PAS5 may be formed as an inorganic layer (e.g., a silicon nitride layer, a silicon oxynitride layer, a silicon oxide layer, a titanium oxide layer, or an aluminum oxide layer).

The side surface line SSL may be located a top surface edge, a side surface, and a bottom surface edge of the substrate SUB. One end of the side surface line SSL may be connected to the pad PAD_C. The one end of the side surface line SSL may be connected to the pad PAD_C through a thirty-sixth contact hole CT36 penetrating the third protective layer PAS3. The other end of the side surface line SSL may be connected to the lower connection line CCL.

The side surface line SSL may be located on a side surface of the substrate SUB, a side surface of the buffer layer BF, a side surface of the first gate insulating layer GI1, a side surface of the second gate insulating layer GI2, a side surface of the interlayer insulating layer ILD, a side surface of the first protective layer PAS1, and a side surface of the third via layer VIA3 (and/or the second via layer VIA2).

Because the pad PAD_C formed at the top surface edge of the substrate SUB and the lower connection line CCL formed at the bottom surface edge of the substrate SUB are connected to each other through the side surface line SSL, a coating pattern surrounding an edge area (or the side surface line SSL) may be formed so as to protect the side surface line SSL exposed to the outside from moisture and oxygen, and to reduce or prevent the likelihood of the side surface line SSL exposed to the outside being externally viewed by a user.

A flexible film FPCB may be located on a bottom surface of the fifth protective layer PAS5. The flexible film FPCB may be connected to the lower connection line CCL through a thirty-seventh contact hole CT37 penetrating the fifth via layer VIA5 and the fifth protective layer PAS5 by using a conductive adhesive member CAM. A source driving circuit for supplying a data signal to the data line may be located on a bottom surface of the flexible film FPCB. The conductive adhesive member CAM may be an anisotropic conductive film or an anisotropic conductive paste.

As described above, in the display device 10_C in accordance with the comparative embodiments, the source driving circuit of the flexible film FPCB, which is located on the bottom of the substrate SUB, may be connected to the data line DL through the lower connection line CCL located on the bottom of the substrate SUB, the side surface line SSL, and the pad PAD_C. The source driving circuit is located on the bottom of the substrate SUB, so that a pixel can be formed even at an edge of the substrate SUB. However, in addition to a process of forming the thin film transistor TFT on the top of the substrate SUB, a process of forming the lower connection line CCL and the side surface line SSL on the bottom and the side surface of the substrate SUB is suitable, and a manufacturing process of the display device 10_C may be relatively complicated. On the other hand, all of the components of the sub-pixel SPX shown in FIG. 7 (and the display device 10 (see FIGS. 1 and 2) including the sub-pixel SPX) can be formed on one surface of the substrate SUB through a continuous process. Thus, as compared with the display device 10_C in accordance with the comparative embodiments, the manufacturing process of the display device including the sub-pixel SPX shown in FIG. 7 is relatively simplified, and the yield of the display device can be relatively improved.

Figure 19:
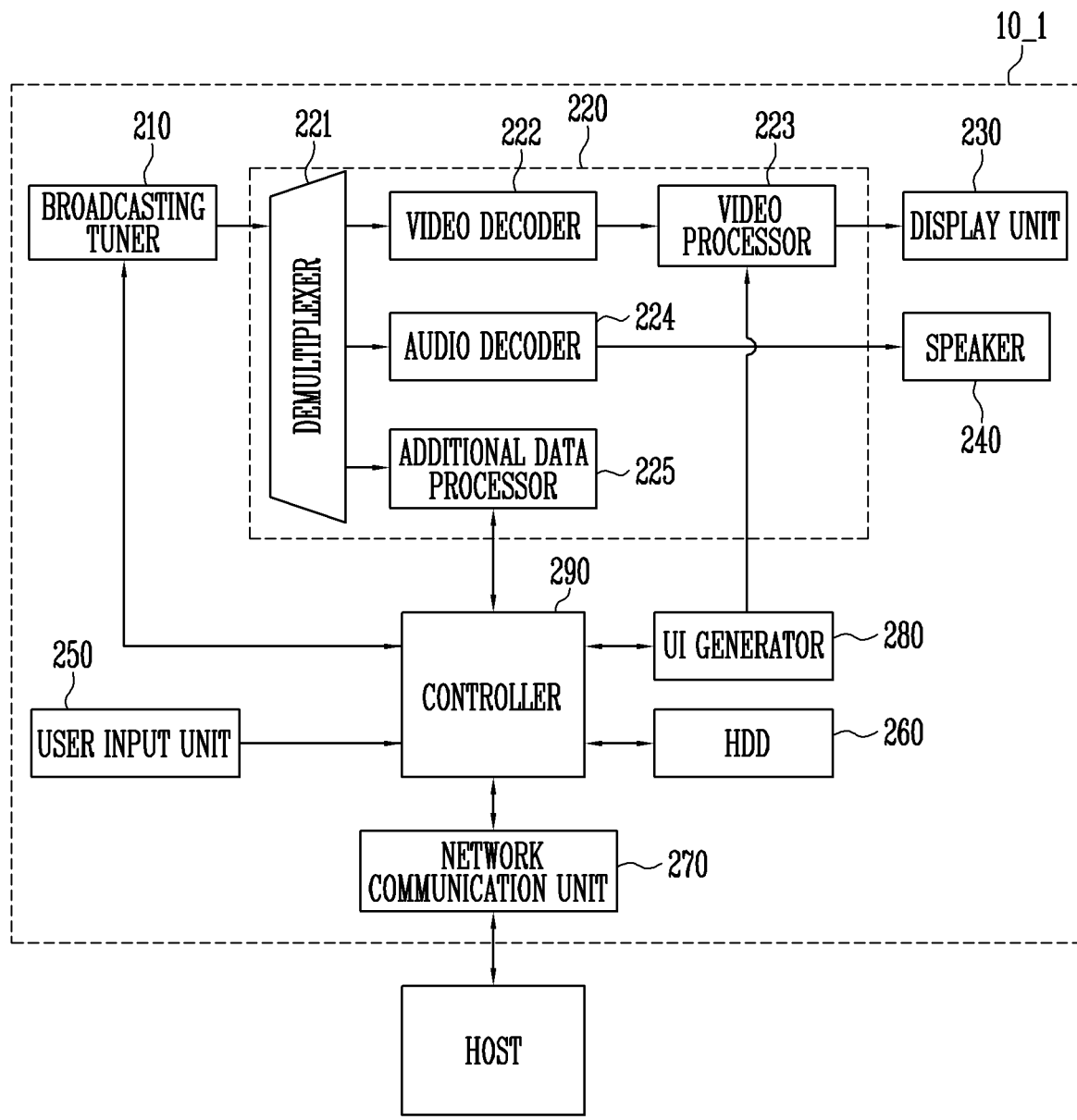
FIG. 19 is a block diagram illustrating a tiled display device in accordance with one or more embodiments of the present disclosure.

FIG. 19 is a block diagram illustrating a tiled display device in accordance with one or more embodiments of the present disclosure. For convenience of description, the first display device 10_1 and a host system HOST are illustrated in FIG. 19.

Referring to FIGS. 12 and 19, the tiled display device TD in accordance with the present disclosure may include the host system HOST, a broadcasting tuner 210, a signal processor 220, a display unit 230, a speaker 240, a user input unit 250, a hard disk drive (HDD) 260, a network communication unit 270, a user interface (UI) generator 280, and a controller 290.

The host system HOST may be implemented as any one of a television system, a home theater system, a set-top box, a navigation system, a DVD player, a Blu-ray player, a personal computer (PC), a mobile phone system, and a tablet PC.

A command of a user may be input in various forms to the host system HOST. For example, a command according to a touch input of the user may be input to the host system HOST. Alternatively, a command of the user according to a keyboard input or a button input of a remote controller may be input to the host system HOST.

The host system HOST may receive original video data corresponding to an original image, which is input from the outside. The host system HOST may divide the original video data into video data of which number corresponding to the number of display devices. For example, the host system HOST may divide original video data corresponding to the first display device 10_1, the second display device 10_2, the third display device 10_3, and the fourth display device 10_4 into first video data corresponding to a first image, second video data corresponding to a second image, third video data corresponding to a third image, and fourth video data corresponding to a fourth image. The host system HOST may transmit the first video data to the first display device 10_1, transmit the second video data to the second display device 10_2, transmit the third video data to the third display device 10_3, and transmit the fourth video data to the fourth display device 10_4.

The first display device 10_1 may display the first image according to the first video data, the second display device 10_2 may display the second image according to the second video data, the third display device 10_3 may display the third image according to the third video data, and the fourth display device 10_4 may display the fourth image according to the fourth video data. Accordingly, the user can view an original image obtained by combining the first to fourth images displayed in the first to fourth display devices 10_1 to 10_4.

The first display device 10_1 may include a broadcasting tuner 210, a signal processor 220, a display unit 230, a speaker 240, a user input unit 250, an HDD 260, a network communication unit 270, a UI generator 280, and a controller 290.

The broadcasting tuner 210 may receive a broadcasting signal of a corresponding channel through an antenna by tuning a channel frequency (e.g., predetermined channel frequency) under the control of the controller 290. The broadcasting tuner 210 may include a channel direction module and an RF demodulation module.

A broadcasting signal demodulated by the broadcasting tuner 210 may be processed by the signal processor 220 to be output to the display unit 230 and the speaker 240. The signal processor 220 may include a demultiplexer 221, a video decoder 222, a video processor 223, an audio decoder 224, and an additional data processor 225.

The demultiplexer 221 separates the demodulated broadcasting signal into a video signal, an audio signal, and additional data. The video signal, the audio signal, and the additional data, which are separated, are respectively recovered by the video decoder 222, the audio decoder 224, and the additional data processor 225. The video decoder 222, the audio decoder 224, and the additional data processor 225 recover the video signal, the audio signal, and the additional data in a decoding format corresponding to an encoding format when a broadcasting signal is transmitted.

Meanwhile, the decoded video signal is converted by the video processor 223 to fit a vertical frequency, a resolution, a screen rate, and the like, which are suitable for output standards of the display unit 230, and the decoded audio signal is output to the speaker 240.

The display unit 230 may include a display panel for display an image and a panel driver for controlling driving of the display panel.

The user input unit 250 may receive a signal transmitted from the host system HOST. The user input unit 250 may be provided to input not only data about selection of a channel transmitted from the host system HOST and selection and manipulation of an UI menu, but also data about that the user selects and input a command for communication with another display device.

The HDD 260 is used to store various software programs including an OS program, recorded broadcasting programs, moving images, pictures, and other data, and may be configured as a storage medium such as a hard disk or a nonvolatile memory.

The network communication unit 270 is used to perform near field communication with the host system HOST and another display device, and may be implemented as a communication module including an antenna pattern capable of implementing mobile communication, data communication, Bluetooth, RF, Ethernet, and the like.

The network communication unit 270 may transmit/receive a wireless signal of at least one of a base station, an external terminal, and a sever on a mobile communication network built in according to a technical standard or communication scheme for mobile communication (e.g., global system for mobile communication (GSM), code division multi access (CDMA), code division multi access 2000 (CDMA2000™), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTEA), 5G, and the like) through the antenna pattern that will be described.

The network communication unit 270 may transmit/receive a wireless signal in a communication network according wireless Internet technologies through the antenna pattern that will be described later. The wireless Internet technologies may include, for example, wireless LAN (WLAN), wireless-fidelity (Wi-Fi), Wi-Fi direct, digital living network alliance (DLNA), wireless broadband (Wi-Bro), world interoperability for microwave access (WiMAX), high speed downlink packet access (HSDPA), high speed uplink packet access (HSUPA), long term evolution (LTE), long term evolution-advanced (LTE-A), and the like. The antenna pattern transmits/receives data according to at least one wireless Internet technology in a range including Internet technologies that are not listed in the above.

The UI generator 280 is used to generate a UI menu for communication with the host system HOST and another display device, and may be implemented by an algorithm code and an OSD IC. The UI menu for communication with the host system HOST and another display device may be a menu for specifying a desired opponent digital TV and selecting a desired function.

The controller 290 is used to take charge of overall control of the first display device 10_1 and to take charge of communication control of the host system HOST and the second, third, and fourth display devices 10_2, 10_3, and 10_4. The controller 290 may be implemented by a micro control unit (MCU) in which a corresponding algorithm code for control is stored and executed.

The controller 290 controls a corresponding control command and corresponding data to be transmitted the host system HOST and the second, third, and fourth display devices 10_2, 10_3, and 10_4 through the network communication unit 270 according to an input and selection of the user input unit 250. When a control command (e.g., predetermined control command) and data (e.g., predetermined data) are input from the host system HOST and the second, third, and fourth display devices 10_2, 10_3, and 10_4, an operation is performed according to the corresponding control command.

Meanwhile, a block diagram of the second display device 10_2, a block diagram of the third display device 10_3, and a block diagram of the fourth display device 10_4 are substantially identical to the block diagram of the first display device 10_1 described in conjunction with FIG. 19, and therefore, their descriptions will be omitted.

In accordance with the present disclosure, all components of the display device and the tiled display device are formed on one surface of a substrate through a continuous process. Thus, as compared with a display device in which a pattern is formed on both surfaces of the substrate, the yield of the display device can be improved.

Also, in accordance with the present disclosure, the display device and the tiled display device include a light conversion pattern (e.g., a color conversion particle for converting a wavelength of incident light and emitting the light), so that a full-color image can be expressed by using only a light emitting element of a single color (e.g., a blue light emitting element). As compared with a display device including light emitting elements of several colors, the transfer efficiency of the light emitting element can be improved.

Further, pads and fan-out lines of the display device and the tiled display device are formed in an uppermost layer. Accordingly, any non-emission area or bezel for the pads and the fan-out lines is unnecessary, and thus a bezel-less display can be implemented.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A display device comprising:
a substrate comprising an emission area and a non-emission area;
a pixel circuit layer above the substrate, and comprising a transistor and a signal line in the non-emission area, and a color conversion pattern in the emission area;
a light emitting element above the color conversion pattern, and electrically connected to the transistor;
an insulating layer covering the light emitting element; and
a pad above the insulating layer, and electrically connected to the signal line,
wherein the color conversion pattern is configured to convert a wavelength band of light incident from the light emitting element.

2. The display device of claim 1, wherein the color conversion pattern is in an opening exposing the substrate while penetrating the pixel circuit layer is formed in the emission area.

3. The display device of claim 2, wherein the pixel circuit layer further comprises a color filter between the substrate and the color conversion pattern in the emission area.

4. The display device of claim 3, wherein the transistor and the signal line are separated from the emission area, and
wherein the light emitting element is configured to emit light through the color filter and the substrate in the emission area.

5. The display device of claim 1, wherein the light emitting element comprises a flip chip type micro light emitting diode.

6. The display device of claim 5, further comprising sub-pixels comprising the light emitting element for emitting light of a first color, and configured to respectively express different single colors.

7. The display device of claim 5, further comprising a first connection electrode above the light emitting element, and electrically connecting a first electrode of the light emitting element to the transistor.

8. The display device of claim 1, wherein the pixel circuit layer further comprises a light-blocking layer between the substrate and the transistor in the non-emission area.

9. The display device of claim 8, wherein the light-blocking layer is separated from the emission area in plan view.

10. The display device of claim 1, further comprising a fan-out line above the insulating layer, connected to the pad, and electrically connected to the signal line through a contact hole penetrating the insulating layer.

11. The display device of claim 1, further comprising pixels comprising the light emitting element,
wherein a distance from an outermost one of the pixels to an edge of the substrate in plan view is shorter than a distance between adjacent ones of the pixels in plan view.

12. A display device comprising:
a substrate comprising an emission area and a non-emission area,
a transistor, a signal line, and a power line on the emission area of the substrate;
a light emitting element on the emission area of the substrate;
a first connection electrode above the light emitting element, and electrically connecting a first electrode of the light emitting element to the transistor;
a second connection electrode above the light emitting element, and electrically connecting a second electrode of the light emitting element to the power line;
an insulating layer over the first connection electrode and the second connection electrode; and
a pad above the insulating layer, electrically connected to the signal line, and comprising at least a portion overlapping the light emitting element in plan view.

13. The display device of claim 12, further comprising a color filter between the substrate and the light emitting element in the emission area.

14. The display device of claim 13, wherein the transistor and the signal line are separated from the emission area in plan view, and
wherein the light emitting element is configured to emit light through the color filter and the substrate in the emission area.

15. The display device of claim 12, wherein the light emitting element comprises a flip chip type micro light emitting diode.

16. The display device of claim 12, further comprising a light-blocking layer between the substrate and the transistor in the non-emission area.

17. A tiled display device comprising:
display devices; and
a joining part between the display devices,
wherein a first display device among the display devices comprises:
a substrate comprising an emission area and a non-emission area;
a pixel circuit layer above the substrate, and comprising a transistor and a signal line in the non-emission area, and a color conversion pattern in the emission area;
a light emitting element above the color conversion pattern, and electrically connected to the transistor;
an insulating layer covering the light emitting element; and
a pad above the insulating layer, and electrically connected to the signal line,
wherein the color conversion pattern is configured to convert a wavelength band of light incident from the light emitting element.

18. The tiled display device of claim 17, wherein the light emitting element comprises a flip chip type micro light emitting diode.

19. The tiled display device of claim 17, wherein the substrate comprises glass.

20. The tiled display device of claim 17, wherein the display devices are arranged in a matrix form on M rows and N columns.

* * * * *